US012142627B2

(12) United States Patent
Ota et al.

(10) Patent No.: US 12,142,627 B2
(45) Date of Patent: Nov. 12, 2024

(54) PHOTOELECTRIC CONVERSION APPARATUS, PHOTOELECTRIC CONVERSION SYSTEM, AND MOVING BODY

(71) Applicant: CANON KABUSHIKI KAISHA, Tokyo (JP)

(72) Inventors: Yasuharu Ota, Tokyo (JP); Tomoya Sasago, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 478 days.

(21) Appl. No.: 17/580,165

(22) Filed: Jan. 20, 2022

(65) Prior Publication Data
US 2022/0238589 A1     Jul. 28, 2022

(30) Foreign Application Priority Data
Jan. 22, 2021   (JP) ................................ 2021-008440

(51) Int. Cl.
*H01L 27/146*      (2006.01)
(52) U.S. Cl.
CPC .. *H01L 27/14636* (2013.01); *H01L 27/14621* (2013.01); *H01L 27/14627* (2013.01); *H01L 27/14634* (2013.01); *H01L 27/14645* (2013.01)

(58) Field of Classification Search
CPC ......... H01L 27/14636; H01L 27/14621; H01L 27/14627; H01L 27/14634; H01L 27/14645
USPC ........................................................ 257/444
See application file for complete search history.

(56) References Cited

U.S. PATENT DOCUMENTS

| 2019/0051720 | A1  | 2/2019  | Kuroda    |              |
|--------------|-----|---------|-----------|--------------|
| 2021/0043792 | A1* | 2/2021  | Iwata     | H01L 27/14643 |
| 2022/0006968 | A1* | 1/2022  | Yamashita | H01L 27/14603 |
| 2022/0359620 | A1* | 11/2022 | Nishio    | H01L 27/14634 |

FOREIGN PATENT DOCUMENTS

| JP | 2014082420 A | 5/2014 |
| JP | 2019007877 A | 1/2019 |
| JP | 2019158806 A | 9/2019 |
| JP | 2020123762 A | 8/2020 |
| JP | 2021005654 A | 1/2021 |

* cited by examiner

*Primary Examiner* — Tong-Ho Kim
(74) *Attorney, Agent, or Firm* — Canon U.S.A., Inc. IP Division

(57) ABSTRACT

The wiring is configured so that both ends of a region including each of a plurality of pixel circuits in a first direction and both ends of the region in a second direction intersecting the first direction are connected by a combination of a wiring layer group.

20 Claims, 23 Drawing Sheets

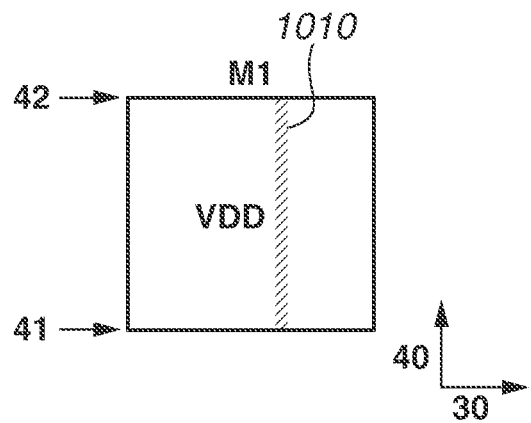
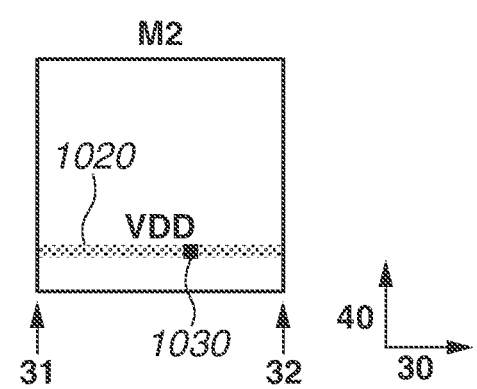
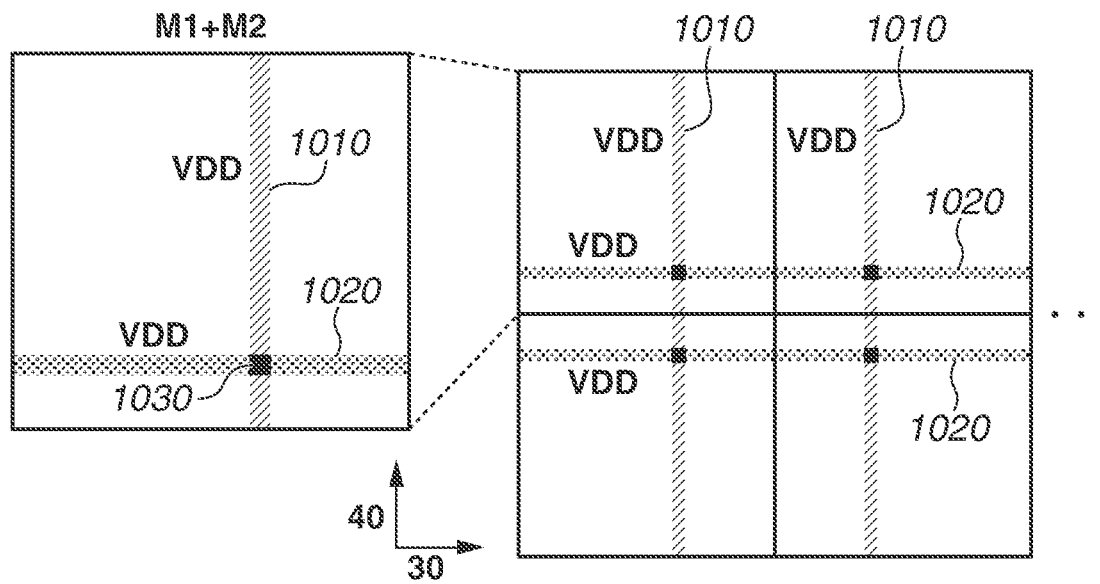

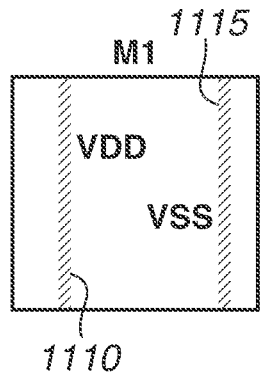 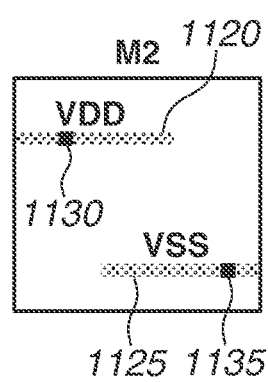 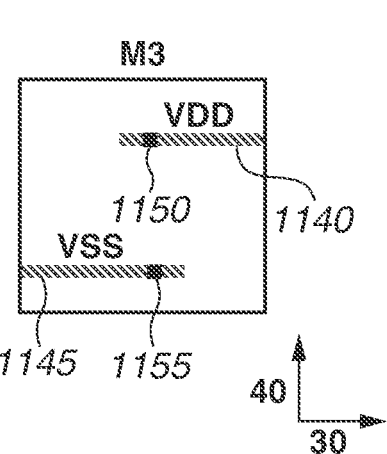
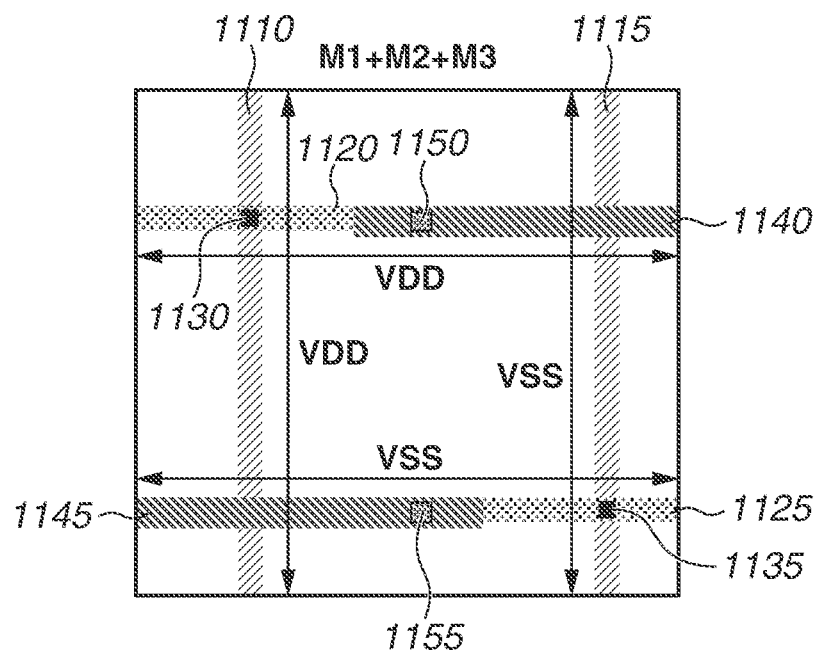

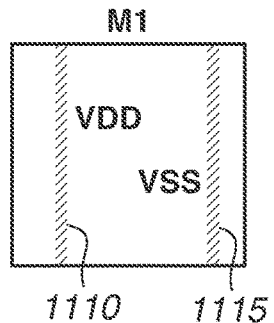
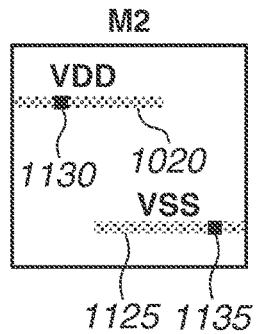
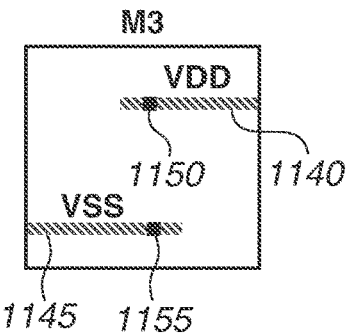
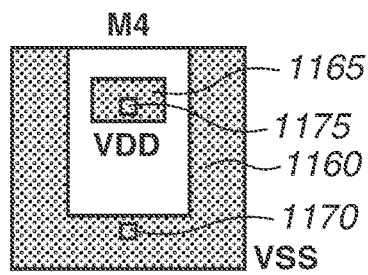
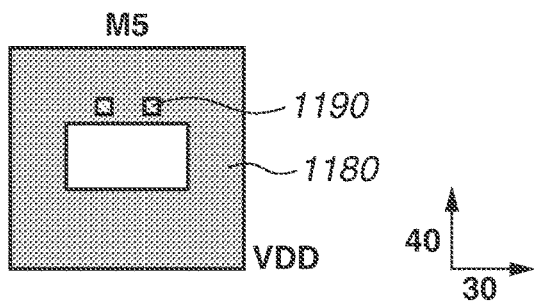
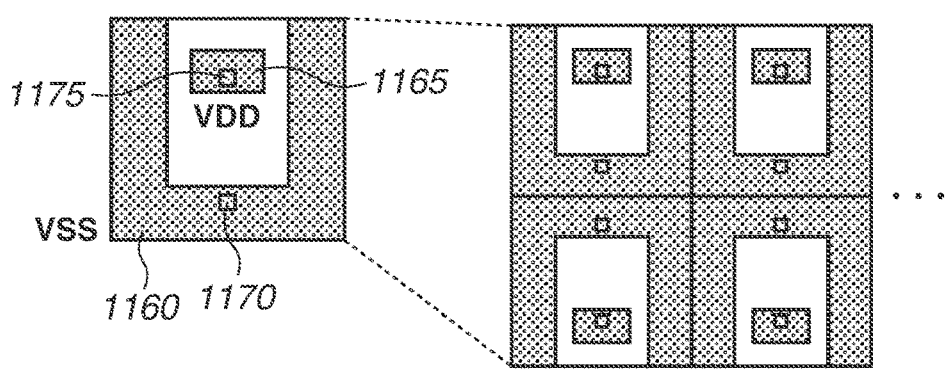
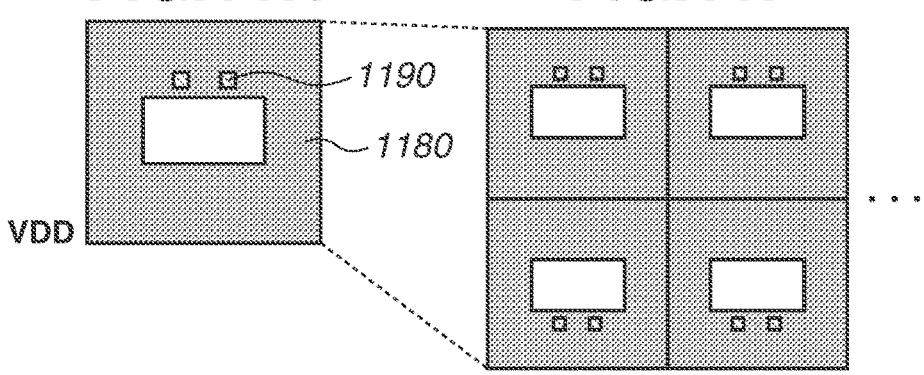

FIG.21B
FRONT VIEW
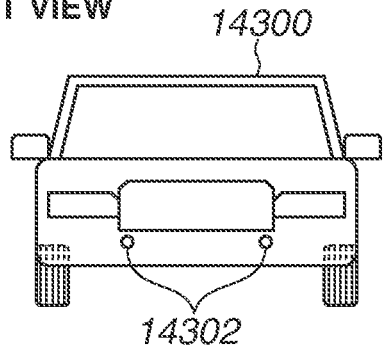
TOP VIEW
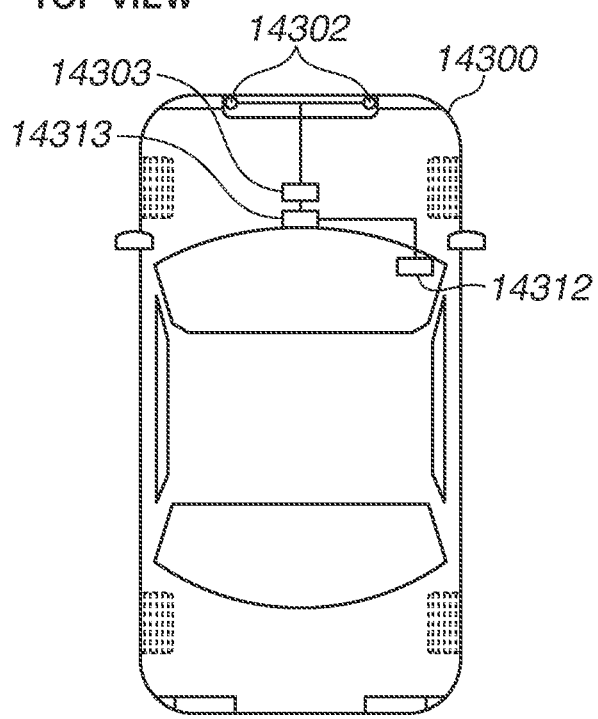
REAR VIEW
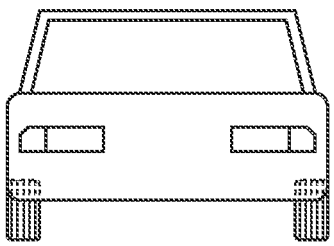

PHOTOELECTRIC CONVERSION APPARATUS, PHOTOELECTRIC CONVERSION SYSTEM, AND MOVING BODY

BACKGROUND

Field of the Disclosure

The present disclosure relates to a photoelectric conversion apparatus, a photoelectric conversion system, and a moving body.

Description of the Related Art

A photoelectric conversion apparatus including a pixel array where a plurality of pixels each including an avalanche photodiode (APD) is two-dimensionally arranged has been known. In each pixel, a reverse bias voltage is applied to the PN junction diode, whereby a photocharge resulting from a single photon causes avalanche multiplication. There are at least two modes of APD operation. One is a Geiger mode where the ADP supplied with a reverse bias voltage is operated with a potential difference between the anode and the cathode greater than its breakdown voltage. The other is a linear mode where the APD is operated with a potential difference between the anode and the cathode near the breakdown voltage, or less than or equal to the breakdown voltage. An APD operated in the Geiger mode is referred to as a single photon avalanche diode (SPAD).

Japanese Patent Application Laid-Open No. 2019-158806 discusses an SPAD sensor including a stack of a first substrate and a second substrate. The first substrate includes APDs, and the second substrate include a signal processing circuit that processes signals from the APDs. Japanese Patent Application Laid-Open No. 2019-158806 also discusses a counter circuit that counts the number of incident photons.

An APD sensor includes a large numbers of circuits in the pixels, includes a large amount of power supply wiring to the circuits and a large amount of input and output wiring to/from the circuits, and has high wiring density, compared to a complementary metal-oxide-semiconductor (CMOS) sensor. However, Japanese Patent Application Laid-Open No. 2019-158806 includes no discussion of a wiring configuration that solves issues caused by the high wiring density of the APD sensor.

SUMMARY

The present disclosure is directed to providing a wiring configuration that solves the issues caused by the high wiring density of an APD sensor.

According to an aspect of the present invention, a photoelectric conversion apparatus includes a first substrate including a first semiconductor layer and a first wiring structure, the first semiconductor layer including a plurality of photoelectric conversion units, the first wiring structure including at least one wiring layer, and a second substrate including a second semiconductor layer and a second wiring structure, the second semiconductor layer including a plurality of pixel circuits disposed to correspond to the respective plurality of photoelectric conversion units, the second wiring structure including a plurality of wiring layers, wherein each of the plurality of photoelectric conversion units includes an avalanche photodiode, wherein the first substrate and the second substrate are stacked so that the first wiring structure and the second wiring structure are interposed between the first semiconductor layer and the second semiconductor layer, wherein the plurality of wiring layers of the second wiring structure includes a wiring layer where first wiring configured to supply a power supply voltage to the plurality of pixel circuits is disposed, the wiring layer having a largest occupation area of the first wiring among the plurality of wiring layers, and a wiring layer group where the first wiring is disposed, the wiring layer group being interposed between the wiring layer and the second semiconductor layer, and wherein in a plan view, the first wiring is configured so that both ends of a region including each of the plurality of pixel circuits in a first direction and both ends of the region in a second direction intersecting the first direction are connected by a combination of the wiring layer group.

Further features of the present invention will become apparent from the following description of exemplary embodiments with reference to the attached drawings.

BRIEF DESCRIPTION OF THE DRAWINGS

FIGS. 7A to 7D are diagrams illustrating a wiring layout of a power supply voltage according to a first exemplary embodiment.

FIGS. 10A to 10D are diagrams illustrating a wiring layout of power supply voltages according to a second exemplary embodiment.

FIGS. 11A to 11I are diagrams illustrating a wiring layout of power supply voltages according to the second exemplary embodiment.

FIGS. 21A and 21B are diagrams illustrating a photoelectronic conversion system and a moving body according to a tenth exemplary embodiment.

DESCRIPTION OF THE EMBODIMENTS

Figure 1:
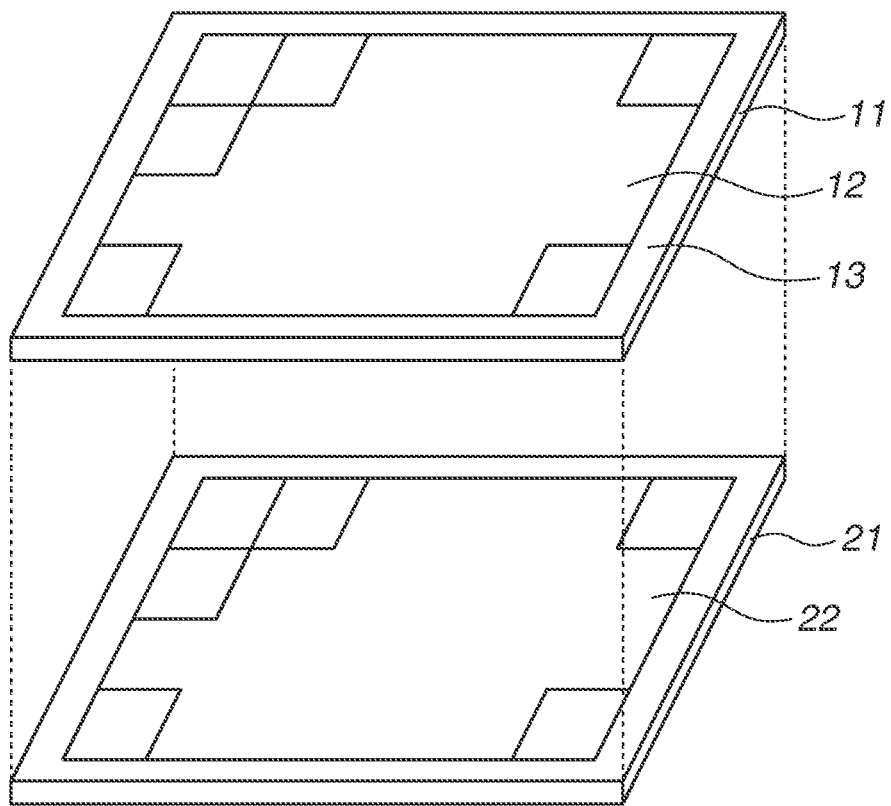
FIG. 1 is a block diagram of a photoelectric conversion apparatus.

The following exemplary embodiments are intended to embody the technical concept of the present invention and not limit the present invention. For clarity of description, sizes and a positional relationship of members illustrated in the drawings may be exaggerated. In the following description, similar components are denoted by the same reference numerals, and a description thereof may be omitted.

In particular, the following exemplary embodiments relate to a photoelectric conversion apparatus including single photon avalanche diodes (SPADs) that count the numbers of photons incident thereon. The photoelectric conversion apparatus can include at least avalanche diodes, which may be operated not only in a Geiger mode but in a linear mode as well.

In the following description, the anode of an avalanche diode is set to a fixed potential, and a signal is taken out from the cathode. A semiconductor region of a first conductivity type where charges of the same conductivity type as the signal charge are the majority carriers refers to an N-type semiconductor region, and a semiconductor region of a second conductivity type a P-type semiconductor region. Note that an exemplary embodiment of the present invention also holds true if the cathode of an avalanche diode is set to a fixed potential and a signal is taken out from the anode. In such a case, the semiconductor region of a first conductivity type where charges of the same conductivity type as the signal charge are the majority carriers refers to a P-type semiconductor region, and the semiconductor region of a second conductivity type an N-type semiconductor region. While the following description deals with cases where either one of the nodes of an avalanche diode is set to a fixed potential, the potentials of both nodes may be variable.

As employed herein, a plan view refers to a view in a direction perpendicular to the light incident surface of a semiconductor layer. A sectional view refers to a plane taken along a direction perpendicular to the light incident surface of a semiconductor layer. If the light incident surface of a semiconductor layer is a microscopically rough surface, the plan view is defined with reference to the light incident surface of the semiconductor layer seen macroscopically.

As employed herein, a wiring layer closest to a semiconductor layer may be referred to as a first wiring layer, and the other wiring layers a second wiring layer, a third wiring layer, and so on in ascending order of distance from the semiconductor layer for the sake of convenience. However, in the claims, a "first wiring layer" is not a wiring layer closest to a semiconductor layer and the ordinal numbers do not refer to the order of wiring layers unless otherwise specified explicitly in the claims.

(Overall Block Diagram of Photoelectric Conversion Apparatus)

A first exemplary embodiment will be described. FIG. 1 is a diagram illustrating the entirety of a photoelectric conversion apparatus 100. A first substrate 11 is also called a sensor chip, and includes a pixel area 12 where pixels including photoelectric conversion units are two-dimensionally arranged. A peripheral area 13 is located between the pixel area 12 and chip ends of the photoelectric conversion apparatus 100. A second substrate 21 is also called a pixel circuit chip, and includes a signal processing circuit area 22 for processing signals from the photoelectric conversion units. The first substrate 11 and the second substrate 21 are stacked to constitute the photoelectric conversion apparatus 100. Although not illustrated in the diagram, a third substrate may further be stacked on the stack of the first and second substrates 11 and 21. In such a case, the third substrate can include a signal processing circuit for processing signals output from the second substrate 21. For example, a processing circuit that performs various types of processing using a trained model generated by machine learning through execution of a program stored in a memory may be included as the signal processing circuit. The trained model is generated by machine learning using a deep neural network (DNN). The signal processing circuit performs calculation processing based on the trained model, using signals output from the pixel area 12. Calculation results include image data obtained by performing calculation processing using the trained model, and various types of information (metadata) obtained from the image data.

(Block Diagram of First Substrate)

Figure 2:
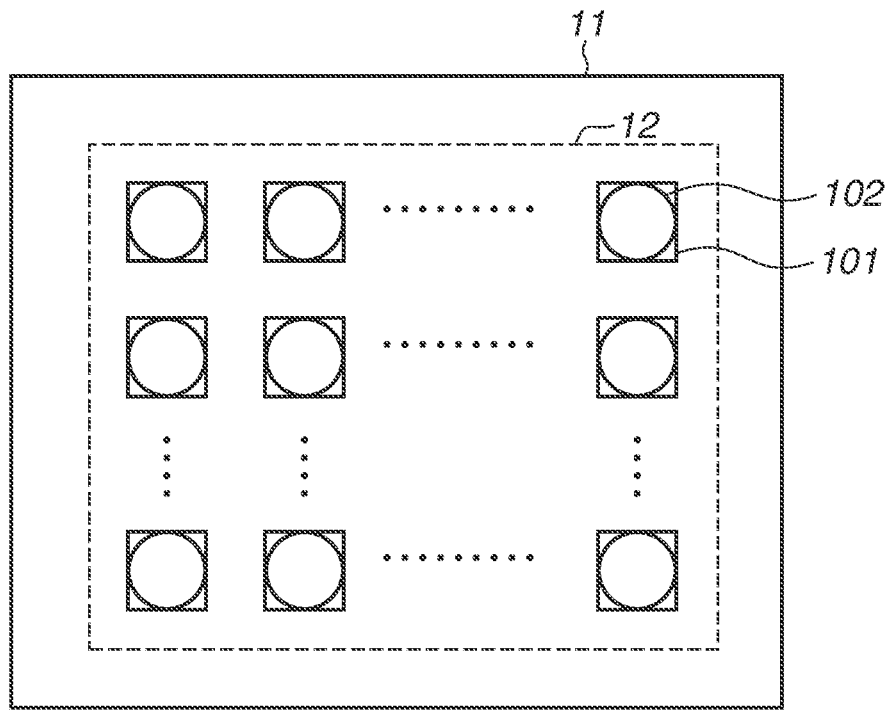
FIG. 2 is a functional block diagram of a first substrate.

FIG. 2 is a block diagram of the first substrate 11. The first substrate 11 includes the pixel area 12 where pixels 101 each including a photoelectric conversion unit 102 including an avalanche photodiode (APD) are two-dimensionally arranged. The pixels 101 in the pixel area 12 may be one-dimensionally arranged. Details of the photoelectric conversion units 102 will be described below.

The pixels 101 are typically ones for forming an image, whereas the pixels 101 do not necessarily need to form an image when used for time of flight (ToF) applications. In other words, the pixels 101 may be elements for measuring the time of arrival of light and the amount of light.

(Block Diagram of Second Substrate)

Figure 3A:
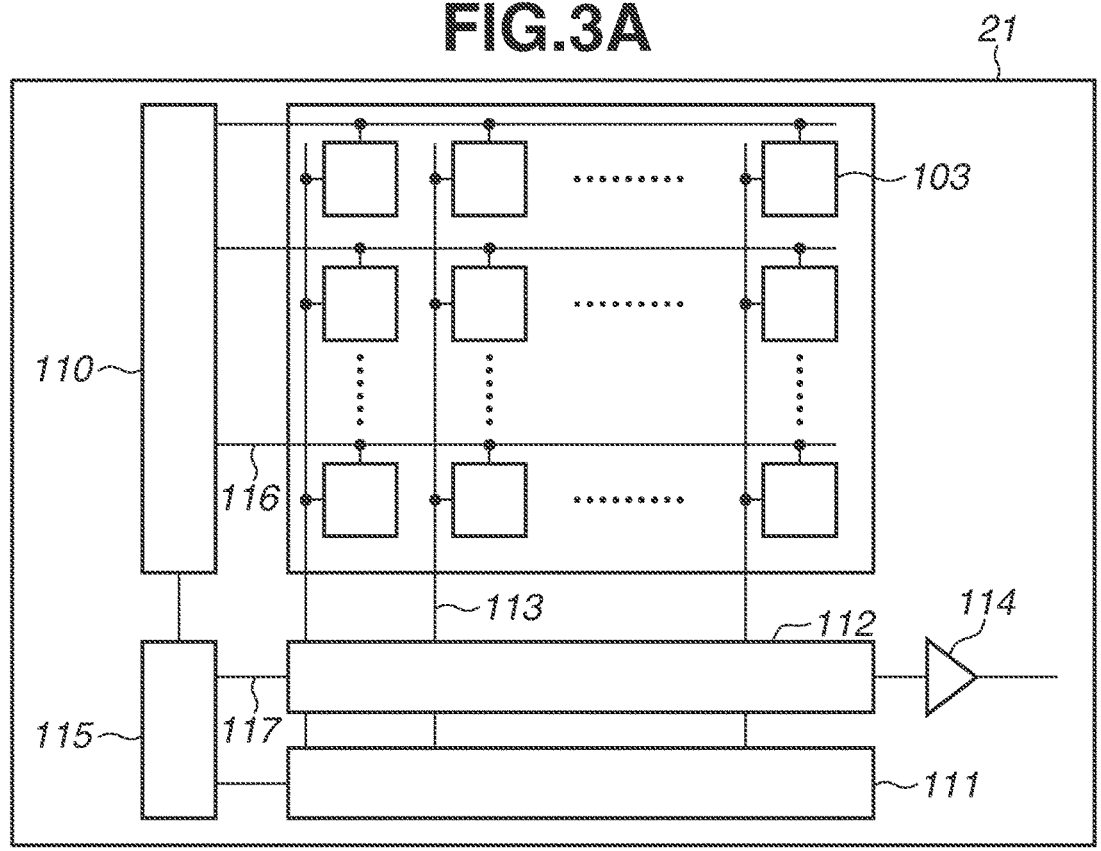
FIGS. 3A and 3B are functional block diagrams of a second substrate.

FIG. 3A is a functional block diagram of the second substrate 21. The second substrate 21 includes a plurality of signal processing units 103 that processes signals photoelectrically converted by the photoelectric conversion units 102. The plurality of signal processing units 103 is two-dimensionally arranged in a signal processing circuit area 22. The signal processing units 103 can be said to be pixel circuits arranged to correspond to the respective pixels. The signal processing unit 103 include counters and memories, and digital values are stored in the memories. Signals output from the signal processing units 103 are transmitted to signal lines 113 using a vertical scanning circuit 110 and a horizontal scanning circuit 111.

The vertical scanning circuit 110 receives control pulses supplied from a control pulse generation unit 115 and supplies the control pulses to the pixels 101. Logic circuits such as a shift register and an address decoder are used for the vertical scanning circuit 110.

The horizontal scanning circuit 111 inputs control pulses for sequentially selecting columns to the signal processing units 103 to read signals from the memories of the pixels where digital values are stored.

In the selected row, the signal processing unit 103 of a pixel selected by the vertical scanning circuit 110 outputs a signal to the signal line 113.

The signals transmitted to the signal lines 113 are output to outside via a reading circuit 112 and an output circuit 114. The signal lines 113 are laid to extend vertically. The vertical scanning circuit 110, the horizontal scanning circuit 111, and the reading circuit 112 are controlled by pulses from the control pulse generation unit 115.

Figure 3B:
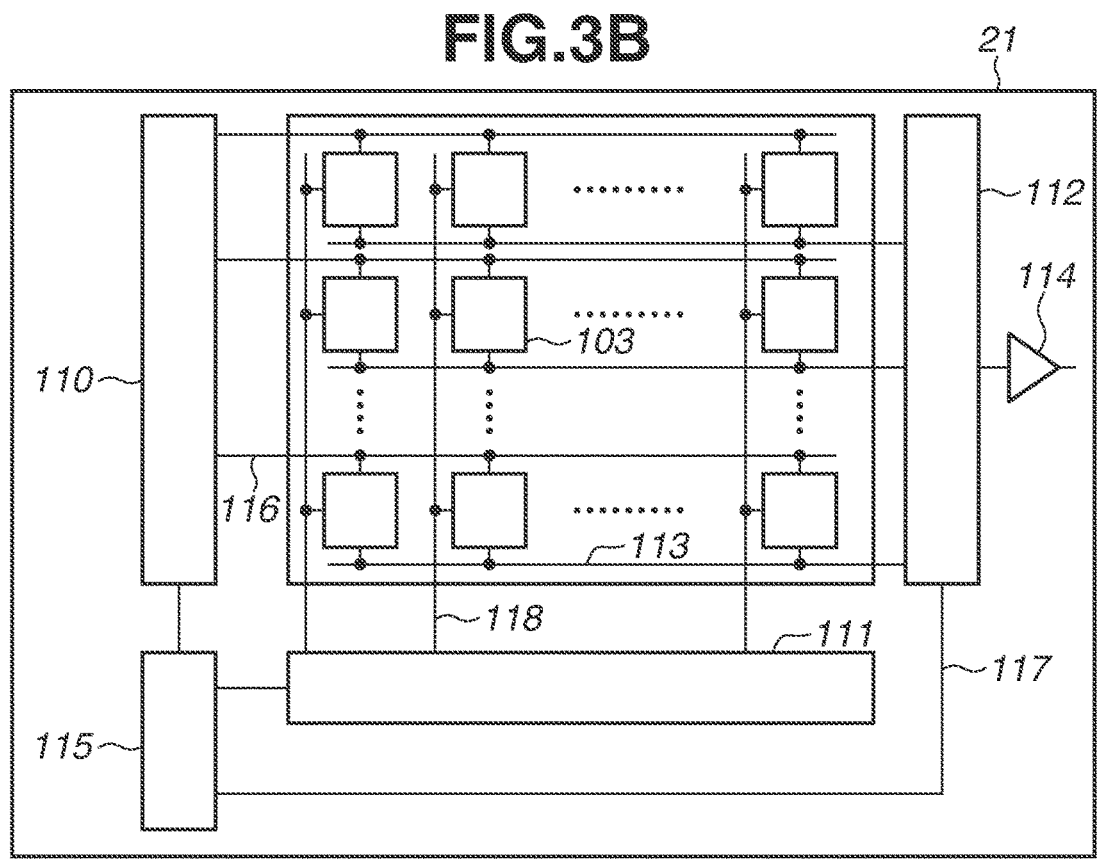

FIG. 3B illustrates another configuration of the second substrate 21. A difference is that the signal lines 113 in FIG. 3B are laid to extend laterally (horizontally) while the signal lines 113 in FIG. 3A are laid to extend vertically (in a column direction). The reading circuit 112 is thus located at a lower part of the signal control circuit area 22 in FIG. 3A, and on the right of the signal processing circuit area 22 in FIG. 3B.

In FIGS. 2, 3A, and 3B, each pixel 101 is provided with a corresponding signal processing unit 103. However, a plurality of pixels 101 may share a signal processing unit 103 to perform sequential signal processing, for example. This can save space of the signal processing circuit area 22.

(Functional Block Diagram of Photoelectric Conversion Apparatus)

Figure 4:
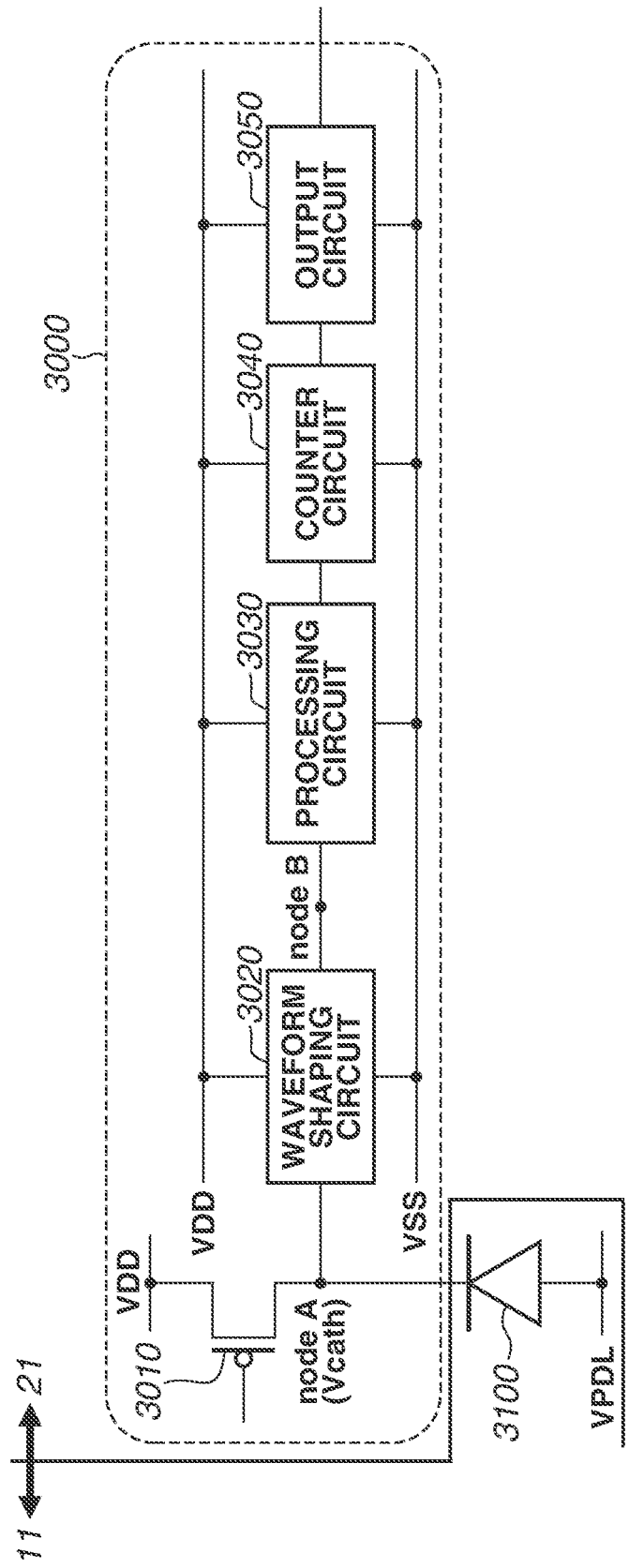
FIG. 4 is a functional block diagram of the first substrate and the second substrate.

FIG. 4 is a diagram for describing the block diagrams described in FIGS. 2, 3A, and 3B in more detail.

FIG. 4 illustrates that an APD 3100 is disposed on the first substrate 11, and other members are disposed on the second substrate 21.

If light is incident on the APD 3100, the APD 3100 generates a charge pair by photoelectric conversion. A voltage VPDL (first voltage) is supplied to the anode of the APD 3100. A voltage VDD (second voltage) higher than the voltage VPDL supplied to the anode is supplied to the cathode of the APD 3100.

A reverse bias voltage at which the APD 3100 makes an avalanche multiplication operation is supplied across the anode and the cathode. With such a voltage applied, the charges generated by the incident light cause avalanche multiplication to generate an avalanche current.

The mode where the APD supplied with a reverse bias voltage is operated with a potential difference between the anode and the cathode greater than its breakdown voltage is referred to as a Geiger mode. The mode where the APD is operated with a potential difference between the anode and the cathode near the breakdown voltage or less than or equal to the breakdown voltage is referred to as a linear mode. An APD operating in the Geiger mode is called SPAD. For example, the voltage VPDL (first voltage) is −30 V, and the voltage VDD (second voltage) is 1 V. In such a case, a potential difference between a voltage VSS (third voltage) of 0 V and the voltage VPDL (first voltage) is greater than a potential difference between the voltage VSS (third voltage) and the voltage VDD (second voltage). The voltage VPDL (first voltage) may therefore sometimes be referred to as a high voltage.

A quenching element 3010 is connected to a power supply for supplying the voltage VDD and the APD 3100.

The quenching element 3010 has a function of replacing a change in the avalanche current occurring in the APD 3100 with a voltage signal. The quenching element 3010 functions as a load circuit (quenching element) during signal multiplication by avalanche multiplication to reduce the voltage supplied to the APD 3100 and suppress the avalanche multiplication (quenching operation).

A pixel circuit 3000 includes a waveform shaping circuit 3020, a processing circuit 3030, a counter circuit 3040, and an output circuit 3050 aside from the quenching element 3010.

The waveform shaping circuit 3020 shapes the change in the potential of the cathode of the ADP 3100 obtained during photon detection and outputs a pulse signal. For example, an inverter circuit is used as the waveform shaping circuit 3020. The waveform shaping circuit 3020 may be an inverter. A circuit formed by connecting a plurality of inverters in series or other circuits having a waveform shaping effect may be used as the waveform shaping circuit 3020.

The processing circuit 3030 is a circuit for performing given signal processing. For example, the processing circuit 3030 is a circuit for selecting whether to input the signal output from the waveform shaping circuit 3020 to the counter circuit 3040. More specifically, the processing circuit 3030 is configured to input the pulse signal output from the waveform shaping circuit 3020 to the counter circuit 3040 in an exposure period. The processing circuit 3030 is also configured not to input the pulse signal output from the waveform shaping circuit 3020, if any, to the counter circuit 3040 in a non-exposure period. As will be described below, the exposure period and the non-exposure period can be set and switched by controlling the quenching element 3010. The provision of the foregoing processing circuit 3030 enables control of the exposure period and the non-exposure period without controlling the quenching element 3010.

The counter circuit 3040 counts the pulse signal output from the waveform shaping circuit 3020 and holds the count value. When a control pulse pRES is supplied via a driving line (not illustrated), the signal (count value) held in the counter circuit 3040 is reset. The counter circuit 3040 is provided for each pixel, which has a large circuit scale. The photoelectric conversion apparatus 100 may therefore include a third substrate, and the counter circuits 3040 may be disposed not only on the second substrate 21 but partly on the third substrate as well.

In FIG. 4, the quenching element 3010 is formed of a metal-oxide-semiconductor (MOS) transistor. Clock period pulses may be applied to the gate of the MOS transistor. In such a case, pulses having a predetermined clock period are input to the gate of the quenching element 3010 from a non-illustrated phase-locked loop (PLL) circuit. For example, the quenching element 3010 is a P-channel MOS (PMOS) transistor and turns off if the pulse from the PLL circuit is at a high level. In such a case, the APD 3100 is not recharged and enters a non-detection mode. By contrast, if the pulse from the PLL circuit is at a low level, the quenching element 3101 turns on, and the APD 3100 is recharged and enters a detection mode (standby mode). Since the clock pulses from the PLL circuit have a predetermined period, the output signal is forcefully reset at each clock period. The photon count per pulse is thus one, which enables generation of signals as many as the number of incident photons even at high luminance. The PLL circuit is disposed on either the first substrate 11 or the second substrate 21.

The output circuit 3050 outputs the digital signal output from the counter circuit 3040 to outside. For example, an open-drain buffer is used as the output circuit 3050. If the photoelectric conversion apparatus 100 performs additional calculations as described above, the output circuit 3050 outputs the digital signal not to outside but to a signal processing circuit inside the photoelectric conversion apparatus 100.

The voltage VDD (second voltage) and the voltage VSS (third voltage) are supplied to the waveform shaping circuit 3020, the processing circuit 3030, the counter circuit 3040, and the output circuit 3050 as driving voltages.

In the foregoing example, the photoelectric conversion apparatus 100 is described to include the counter circuit 3040. However, the photoelectric conversion apparatus 100 may include a time-to-digital converter (TDC; hereinafter, referred to as a TDC circuit) serving as a time measuring circuit instead of the counter circuit 3040. A photoelectric conversion apparatus 100 for obtaining pulse detection timing can thereby be configured.

Here, the TDC circuit converts the generation timing of the pulse signal output from the waveform shaping circuit 3020 into a digital signal. To measure the timing of the pulse signal, a control pulse pREF (reference signal) is supplied to the TDC circuit from the vertical scanning circuit 110 illustrated in FIG. 3A or 3B via a driving line. The TDC circuit obtains, as the digital signal, a signal indicating the input timing of the signal output from each pixel via the waveform shaping circuit 3020 in terms of a relative time with reference to the control pulse pREF.

For example, the TDC circuit includes a reset set (RS) flip-flop, a coarse counter, and a fine counter. The control pulse pREF drives a light emitting unit and sets the RS flip-flop. The signal pulse input from each pixel resets the RS flip-flop. This generates a signal having a pulse width corresponding to the time of flight of the light. The generated signal is counted by the coarse counter and the fine counter with respective predetermined time resolutions. A digital code is thereby output.

The PLL circuit that generates the control pulse pREF of the TDC circuit is disposed on the first substrate 11, the second substrate 21, or both the first substrate 11 and the second substrate 21. If the control pulse pREF to be input to the TDC circuit delays, the accuracy of the information output from the TDC circuit is affected. The PLL circuit is thus desirably disposed on the same substrate as the TDC circuit. For example, in the present exemplary embodiment, both the TDC circuit and the PLL circuit are disposed on the second substrate 21.

Instead of simply replacing the counter circuit 3040 with the TDC circuit, the photoelectric conversion apparatus 100 may include both the counter circuit 3040 and the TDC circuit.

(Relationship Between Operation and Output Signal of ADP)

Figure 5A:
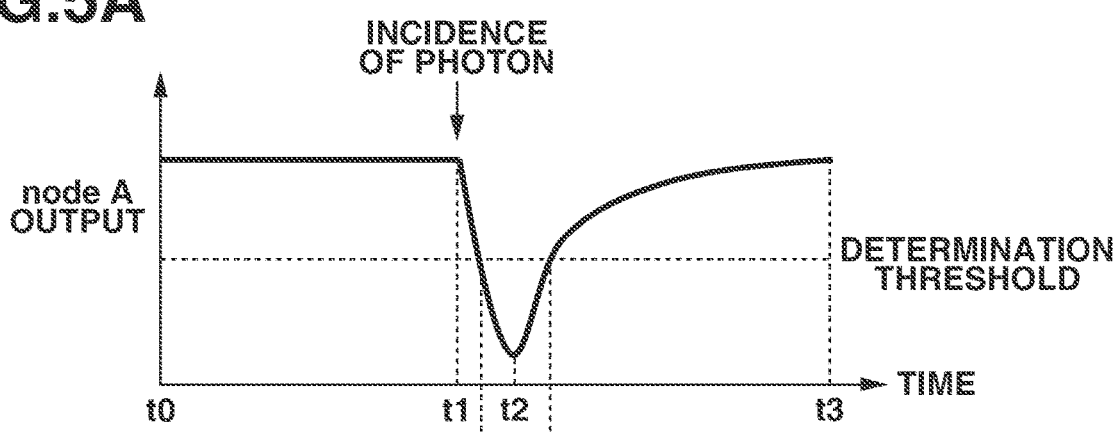
FIGS. 5A and 5B are diagrams schematically illustrating a relationship between an operation and an output signal of an avalanche photodiode (APD).
Figure 5B:
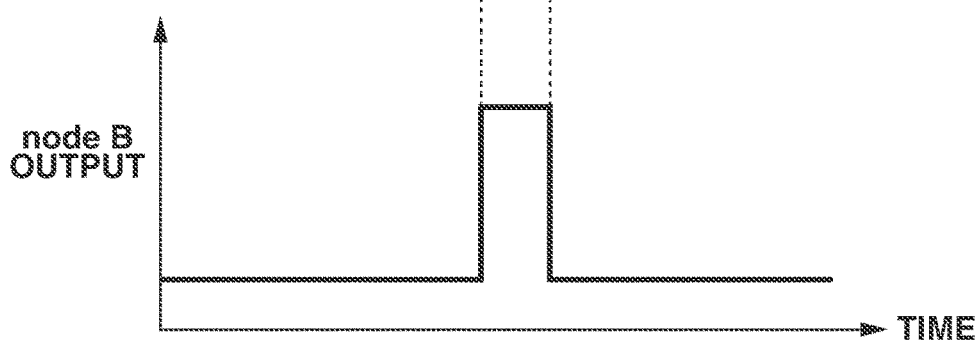

FIGS. 5A and 5B are diagrams schematically illustrating a relationship between the operation and the output signal of the APD. Returning to FIG. 4, an input node Vcath of the waveform shaping circuit 3020 will be referred to as node A, and an output node as node B. FIG. 5A illustrates a change in the waveform of node A of FIG. 4. FIG. 5B illustrates a change in the waveform of node B of FIG. 4.

Between time t0 and t1, a potential difference that enables avalanche multiplication is applied. When a photon is incident at time t1, an avalanche multiplication current flows through the quenching element 3010 and the voltage of node A drops. When the amount of voltage drop increases further and the potential difference applied to the APD 3100 decreases, the avalanche multiplication of the APD 3100 stops and the voltage level of node A ceases to drop at a certain value. A current compensating for the voltage drop from the voltage VPDL then flows through node A, and the voltage of node A stabilizes at the original potential level at time t3. The part of the output waveform of node A falling below a certain threshold (determination threshold) is shaped by the waveform shaping circuit 3020 and output from node B as a signal.

(Sectional View of Photoelectric Conversion Apparatus)

Figure 6:
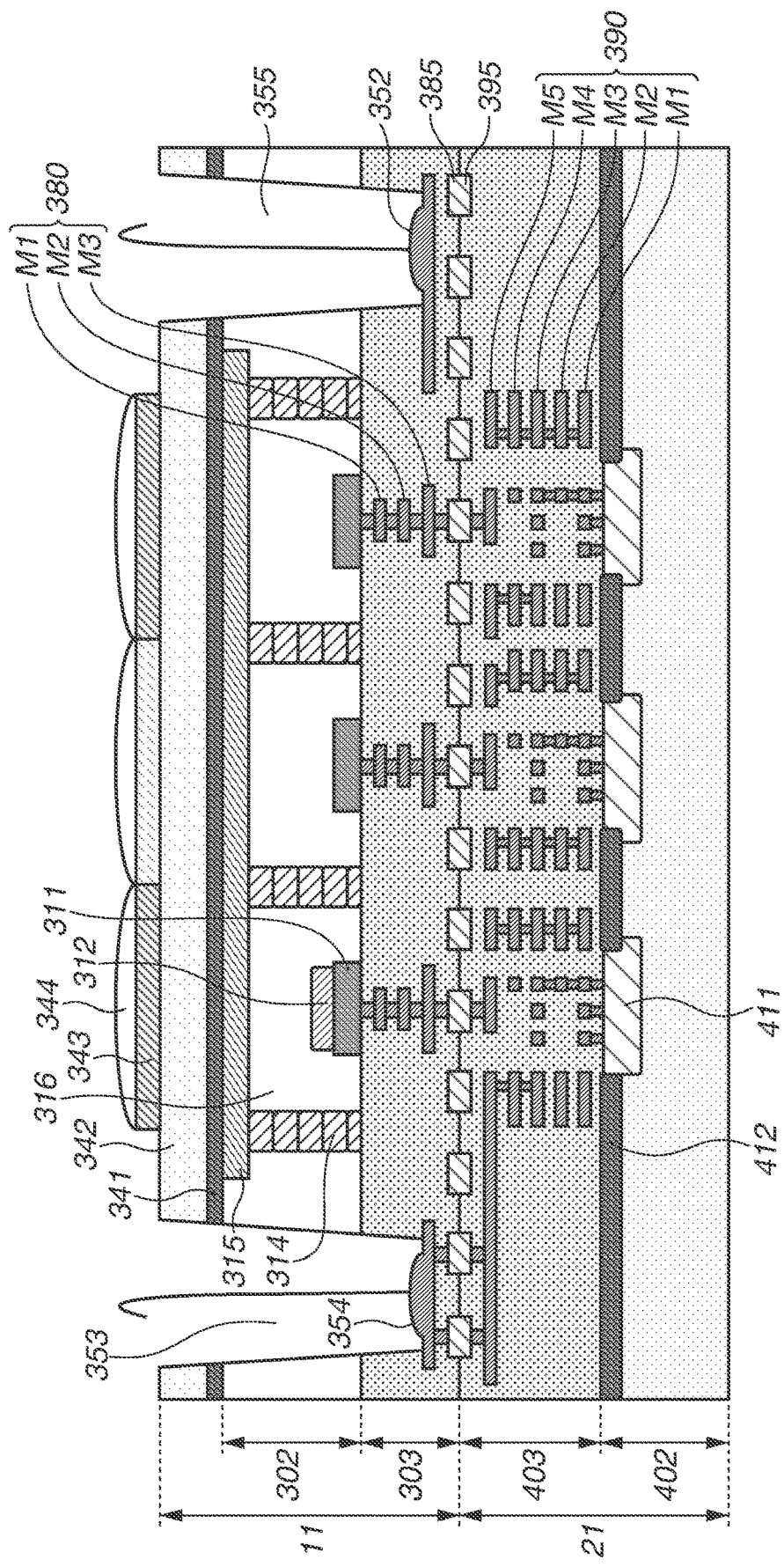
FIG. 6 is a sectional view of the photoelectric conversion apparatus.

FIG. 6 is a sectional view of the photoelectric conversion apparatus 100. Light is incident from above in FIG. 6. The first substrate 11 and the second substrate 21 are stacked in order from the light incident surface side.

The first substrate 11 includes a first substrate semiconductor layer 302 (first semiconductor layer) and a first substrate wiring structure 303 (first wiring structure). The second substrate 21 includes a second substrate semiconductor layer 402 (second semiconductor layer) and a second substrate wiring structure 403 (second wiring structure).

The first substrate 11 and the second substrate 21 are joined so that the first wiring structure 303 and the second wiring structure 403 are opposed to and in contact with each other.

The first semiconductor layer 302 includes a first semiconductor region 311 of a first conductivity type and a second semiconductor region 316 of a second conductivity type, which form a PN junction to constitute the APD 3100 illustrated in FIG. 4.

A third semiconductor region 312 of a second conductivity type is located on the light incident surface side of the first semiconductor region 311. The third semiconductor region 312 has an impurity concentration lower than that of the second semiconductor region 316. As employed herein, the "impurity concentration" refers to a final impurity concentration compensated by impurities of opposite conductivity type. In other words, the "impurity concentration" refers to a net concentration. For example, a region where a P-type additive impurity concentration is higher than an N-type additive impurity concentration is a P-type semiconductor region.

By contrast, a region where the N-type additive impurity concentration is higher than the P-type additive impurity concentration is an N-type semiconductor region.

The pixels are isolated by fourth semiconductor regions 314 of a second conductivity type. A fifth semiconductor region 315 of a second conductivity type is located on the light incident surface side of the fourth semiconductor regions 314. The fifth semiconductor region 315 is common among the pixels.

The voltage VPDL (first voltage) illustrated in FIG. 4 is supplied to the fourth semiconductor regions 314. The voltage VDD (second voltage) illustrated in FIG. 4 is supplied to the first semiconductor regions 311. The voltage VPDL supplied to the fourth semiconductor regions 314 and the voltage VDD supplied to the first semiconductor regions 311 supply a reverse bias voltage to the second semiconductor regions 312 and the first semiconductor regions 311. A reverse bias voltage at which the APDs 3100 make an avalanche multiplication operation is thereby supplied.

A pinning layer 341 is located on the light incident surface side of the fifth semiconductor region 315. The pinning layer 341 is a layer disposed to suppress a dark current. The pinning layer 341 is formed of hafnium oxide ($HfO_2$), for example. The pinning layer 341 may be formed of zirconium oxide ($ZrO_2$) or tantalum oxide ($Ta_2O_5$).

Microlenses 344 are located above the pinning layer 341 with an insulating layer 342 and color filters 343 therebetween. The insulating layer 342 and the color filters 343 may be of any configuration. A grid-shaped light shielding film for optically isolating the pixels may be located between the microlenses 344 and the pinning layer 341. The light shielding film may be formed of any material that can block light. Examples include tungsten (W), aluminum (Al), and copper (Cu).

The second semiconductor layer 402 include active regions 411 formed of semiconductor regions and an isolation region 412. The isolation region 412 is a field region formed of an insulator.

The first wiring structure 303 includes a plurality of wiring layers 380 constituted by stacking a plurality of insulator layers and a plurality of metal layers. As employed herein, a wiring layer refers to a layer including a metal layer, which is located on or under an interlayer film formed of an insulator layer, and insulator members located in the metal layer. As employed herein, a metal layer (via wiring and contact wiring) located in an interlayer film to connect the wiring of a first wiring layer and that of a second wiring layer will therefore not be referred to as a wiring layer. The plurality of wiring layers 380 includes a first wiring layer M1, a second wiring layer M2, and a third wiring layer M3 in order from the first semiconductor layer 302 side. The topmost layer of the first wiring structure 303 includes first bonding portions 385 exposed from the first wiring structure 303. The first wiring structure 303 also has pad openings 353 and 355. Pad electrodes 354 and 352 are located at the bottoms of the pad openings 353 and 355, respectively. The pad electrode 352 is an electrode for supplying a voltage to the circuits of the first substrate 11. For example, the pad electrode 352 supplies the voltage VPDL (first voltage) to the fourth semiconductor regions 314 through via wiring (not illustrated) and contact wiring (not illustrated).

The second wiring structure 403 includes a plurality of wiring layers 390 constituted by stacking a plurality of insulator layers and a plurality of metal layers. The plurality of wiring layers 390 includes a first wiring layer M1 to a fifth wiring layer M5 in order from the second semiconductor layer 402 side. The topmost layer of the second wiring structure 403 includes second bonding portions 395 that are exposed from the second wiring structure 403. The first bonding portions 385 of the first substrate 11 are in contact with and electrically connected to the second bonding portions 395 of the second substrate 12. The bonding of the first bonding portions 385 exposed in the bonding surface of the first substrate 11 and the second bonding portions 395 exposed in the bonding surface of the second substrate 12 may be referred to as a metal bonding (MB) structure or metal junctions. Such bonding may be referred to as Cu—Cu bonding since the bonding is often established between Cu members.

The pad electrode 354 included in the first wiring structure 303 is electrically connected to one of a plurality of pieces of wiring disposed on the plurality of wiring layers 390 via first and second bonding portions 385 and 395. For example, the voltage VSS (third voltage) is supplied from a pad electrode 354 to the circuits included in the pixel circuit 3000. Moreover, the voltage VDD (second voltage) is supplied from a pad electrode 354 to the circuits included in the pixel circuit 3000. The pad electrode 354 also supplies voltage to the wiring of the plurality of wiring layers 390 via first and second bonding portions 385 and 395, and voltage to the wiring of the plurality of wiring layers 380 via second and first bonding portions 395 and 385. For example, the voltage VDD (second voltage) electrically connected to the quenching element 3010 is supplied from a pad electrode 354 through such a route. Specifically, the pad electrode 354 supplies the voltage VDD (second voltage) to first and second bonding portions 385 and 395, and wiring of the plurality of wiring layers 390. The wiring of the plurality of wiring layers 390 then supplies the voltage VDD (second voltage) to the first semiconductor region 311 via the quenching element 3010 located in the second substrate 12, wiring of the plurality of wiring layers 390, and second and first bonding portions 395 and 385.

While only one pad electrode 354 is illustrated in FIG. 6, a plurality of pad electrodes 354 is actually disposed to provide voltages of different values.
(Wiring Configuration Example 1-1 of Plurality of Wiring Layers)

FIGS. 7A to 7D are diagrams illustrating a wiring layout of the voltage VDD (second voltage) illustrated in FIG. 4. As described with reference to FIG. 4, an APD sensor including SPADs includes a large number of circuits constituting a pixel circuit 3000 for each pixel. There is therefore a large amount of power supply wirings to the circuits and input and output wiring to/from the circuits, and the wiring density between the circuits is high. The higher the wiring density, the more likely the wiring of the voltage VDD (second voltage) and the voltage VSS (third voltage) serving as power supplies for the circuits is to be divided. This can hinder stable current supply. As employed herein, divided refers to that power supply wiring of a wiring layer is not two-dimensionally laid out. That the power supply wiring is two-dimensionally laid out refers to that the power supply wiring in a region where the pixel circuit 3000 for one pixel is disposed is laid out to reach both ends in a first direction and both ends in a second direction. Without such a wiring layout, the power supply wiring of the pixel circuits 3000 of adjoining pixels can fail to be electrically connected when the pixel circuits 3000 of a plurality of pixels are laid out.

In particular, SPADs count a large number of photons at high luminance, and the amount of current flowing through the power supply wiring of the circuits constituting the pixel circuits 3000 is high. The wiring of the power supply to the pixel circuits 3000 is therefore desirably laid out over the pixel circuits 3000 in an undivided manner Since the number of incident photons and the timing of incidence vary from one pixel circuit 3000 to another, the magnitude and timing of the flowing current also vary from one pixel circuit 3000 to another. The wiring of the power supply to the pixel circuits 3000 is therefore desirably laid out over the pixel circuits 3000 in an undivided manner.

FIGS. 7A and 7B illustrate a picked-out region where a pixel circuit 3000 for one pixel among the pixel circuits 3000 included in the second substrate 21 is disposed. Such a region may be referred to as a region including the pixel circuit 3000 for one unit.

FIG. 7A is a plan view illustrating a layout example of wiring 1010 of the voltage VDD (second voltage) disposed on the first wiring layer M1. FIG. 7B is a plan view illustrating an layout example of wiring 1020 of the voltage VDD (second voltage) disposed on the second wiring layer M2.

In FIG. 7A, the wiring 1010 is laid to extend in a second direction 40. Specifically, in the region where the pixel circuit 3000 for one pixel is disposed, the wiring 1010 is laid to extend in the second direction 40 from an end 41 to an end 42 that are both ends of the region. The wiring 1010 is not laid to extend in a first direction 30 that is a direction intersecting (here, orthogonal to) the second direction 40. The first wiring layer M1 includes wiring that connects the circuits constituting the pixel circuit 3000 to each other as well as gate wiring at a high density. In the first wiring layer M1, the wiring 1010 is therefore obstructed by other pieces of wiring and unable to be extended in the first direction 30.

As illustrated in FIG. 7B, the wiring 1020 of the second wiring layer M2 is then laid to extend in the first direction 30 from an end 31 to an end 32 that are both ends of the foregoing region in the first direction 30, and the wiring 1020 and the wiring 1010 are electrically connected by via wiring 1030. The wiring of the voltage VDD (second voltage) is thus extended in both the first and second directions 30 and 40 by the combination of the two wiring layers M1 and M2.

In the region where the pixel circuit 3000 for one pixel is disposed, both ends in the first direction 30 are thus connected by the wiring 1020 of the second wiring layer M2, and both ends in the second direction 40 are connected by the wiring 1010 of the first wiring layer M1. In other words, the region where the pixel circuit 3000 for one pixel is disposed is configured so that both ends in the first direction 30 and both ends in the second direction 40 are connected in a plan view by the combination of the wiring 1010 and the wiring 1020 of the two wiring layers M1 and M2.

According to the foregoing configuration, the power supply wiring can be two-dimensionally laid out even if the wiring density is high and the wiring for a power voltage is unable to be two-dimensionally arranged by using only one wiring layer. Suppose that a first pixel of high current consumption and a second pixel of low current consumption adjoin each other. In such a case, a current can be supplied from the power supply wiring of the pixel circuit 3000 of the second pixel to the pixel circuit 3000 of the first pixel if the consumption of the current through the power supply wiring of the pixel circuit 3000 of the first pixel is high. This enables stable current supply to the pixel circuits 3000.

FIG. 7C illustrates an example where the wiring of a pixel is laid to extend in both the first and second directions 30 and 40 using the two wiring layers M1 and M2. FIG. 7D illustrates four pixels. The wiring layouts of the pixels are line symmetric about the borders between the pixels. Such an arrangement may be referred to as a mirror symmetric arrangement. Although not illustrated, other pixels adjoining the illustrated four pixels are also in such a line symmetric arrangement.

As illustrated in FIG. 7D, the regions where the pixel circuit 3000 for one pixel is disposed are ones where predetermined wiring patterns are repeated. While FIG. 7D illustrates an example of the mirror symmetric arrangement, the regions where the pixel circuit 3000 for one pixel is disposed are repeated even with such a mirror symmetric arrangement. While FIG. 7D illustrates an example of the mirror symmetric arrangement, the wiring may be laid out in a translational symmetric arrangement. Even in such a case, the regions where the pixel circuit 3000 for one pixel is disposed are repeated.

In the foregoing description, the horizontal direction of the diagram is assumed as the first direction 30, and the vertical direction the second direction 40. However, the vertical direction may be assumed as the first direction 30, and the horizontal direction the second direction 40.

(Wiring Configuration Example 1-2 of Plurality of Wiring Layers)

FIGS. 8A to 8E are diagrams illustrating wiring disposed on the first and second wiring layers M1 and M2 and wiring disposed on the third wiring layer M3 that is a wiring layer above the first and second wiring layers M1 and M2.

Figure 8A:
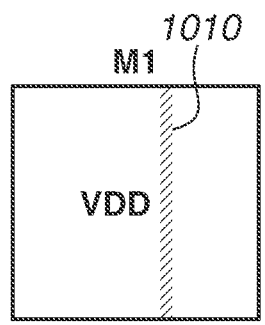
FIGS. 8A to 8E are diagrams illustrating a wiring layout of a power supply voltage according to the first exemplary embodiment.
Figure 8B:
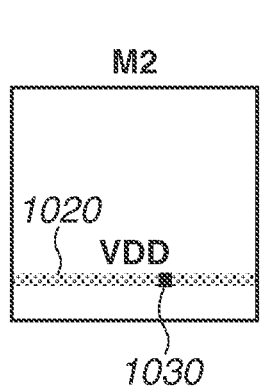

FIGS. 8A and 8B are similar to FIGS. 7A and 7B. A description thereof will thus be omitted.

Figure 8C:
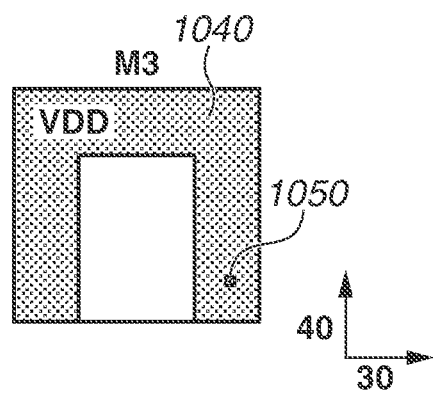
Figures 8D, 8E:
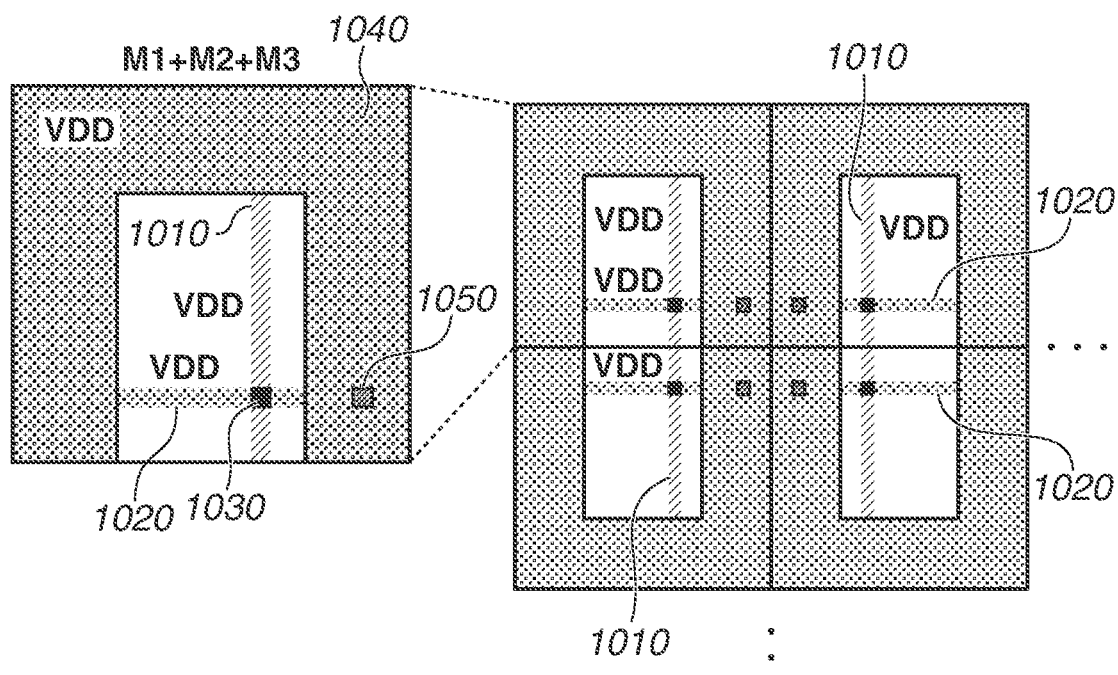

FIG. 8C is a diagram illustrating wiring 1040 for supplying the voltage VDD (second voltage) disposed on the third wiring layer M3. As illustrated in FIG. 8D, the wiring 1040 disposed on the third wiring layer M3 and the wiring 1020 disposed on the second wiring layer M2 are electrically connected by via wiring 1050. In the region where the pixel circuit 3000 for one pixel is disposed, the wiring 1040 of the third wiring layer M3 connects both ends in the first direction 30 and both ends in the second direction 40 in a plan view within the third wiring layer M3 itself. Meanwhile, the first wiring layer M1 and the second wiring layer M2 are configured so that both ends of the region including the pixel circuit 3000 for one pixel in the first direction 30 and both ends of the region in the second direction 40 are connected in a plan view by the combination of the wiring of the two wiring layers.

FIG. 8E illustrates four pixels in the mirror symmetric arrangement.

In general, as a rule of semiconductor processes, the wiring width of wiring laid on a wiring layer (upper wiring layer) farther from a semiconductor layer can be made greater than that of wiring laid on a wiring layer (lower wiring layer) closer to the semiconductor layer. More specifically, the third wiring layer M3 is a wiring layer where the wiring of the voltage VDD (second voltage) has the largest occupation area among the plurality of wiring layers. As illustrated in FIG. 8C, the wiring width of the wiring 1040 for supplying the voltage VDD (second voltage) disposed on the third wiring layer M3 is thus increased to lower the resistance.

The wiring 1040 for supplying the voltage VDD (second voltage) disposed on the third wiring layer M3 is laid to extend so that both ends in the first direction 30 and both ends in the second direction 40 are connected. However, the distance between the third wiring layer M3 and the second semiconductor layer 402 where the pixel circuits 3000 are disposed is greater than the distance between the second wiring layer M2 and the second semiconductor layer 402 and the distance between the first wiring layer M1 and the second semiconductor layer 402. The current supply from the pixel circuit 3000 of a pixel of low current consumption to the pixel circuit 3000 of a pixel of high current consumption can therefore be insufficient if the third wiring layer M3 is used alone. In view of this, the first wiring layer M1 and the second wiring layer M2 are combined to two-dimensionally lay out the power supply wiring even in such a case. This enables stable current supply to the pixel circuits 3000.

In the foregoing example, the first wiring layer M1 and the second wiring layer M2 are a plurality of wiring layers located between the wiring layer of the largest wiring occupation area and the second semiconductor layer 402, and may therefore be referred to as a lower wiring layer group. The first wiring layer M1 and the second wiring layer M2 may be referred to simply as a wiring group.

(Wiring Configuration Example 1-3 of Plurality of Wiring Layers)

Figure 9A:
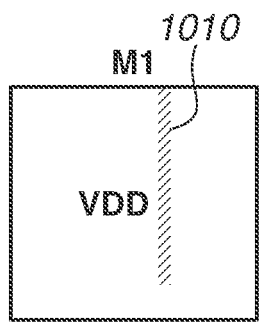
FIGS. 9A to 9E are diagrams illustrating a wiring layout of a power supply voltage according to the first exemplary embodiment.
Figure 9B:
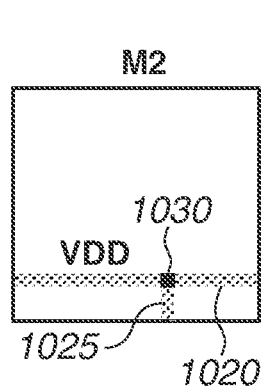
Figure 9C:
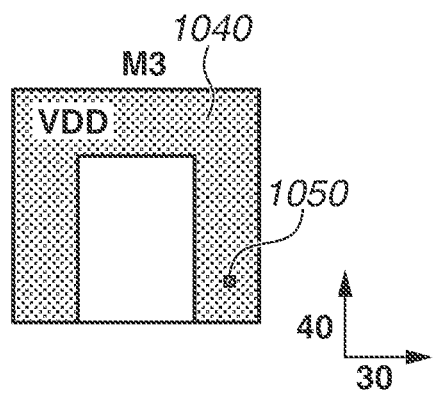
Figure 9D:
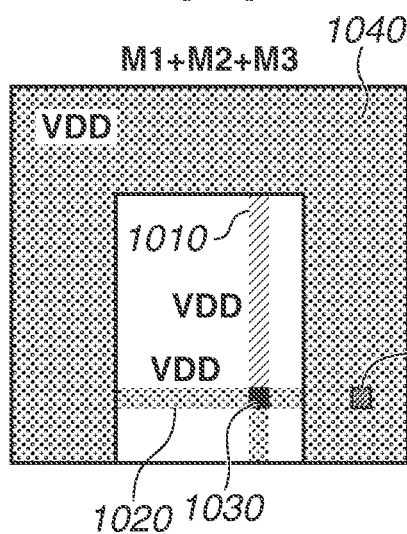
Figure 9E:
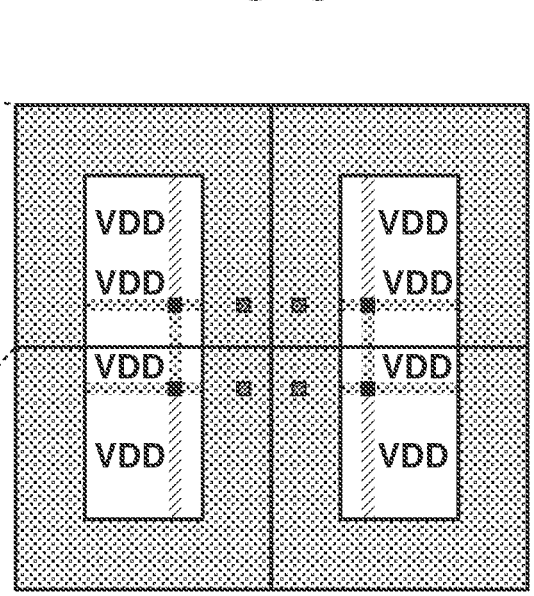

FIGS. 9A to 9E are diagrams illustrating wiring disposed on the first wiring layer M1 to the third wiring layer M3. Since FIG. 9C is similar to FIG. 8C, a description thereof will be omitted.

FIG. 9A is a diagram illustrating wiring 1010 for supplying the voltage VDD (second voltage) disposed on the first wiring layer M1. In FIG. 8A, the wiring 1010 extends in the second direction 40 to reach both ends of the region including the pixel circuit 3000 for one pixel in the second direction 40. FIG. 9A differs in that the wiring 1010 reaches neither both ends of the region in the first direction 30 nor both ends in the second direction 40.

FIG. 9B is a diagram illustrating wiring 1020 for supplying the voltage VDD (second voltage) disposed on the second wiring layer M2. In FIG. 9B, like FIG. 8B, the wiring 1020 extends in the first direction 30 to reach both ends of the region including the pixel circuit 3000 for one pixel in the first direction 30. In addition, in FIG. 9B, wiring 1025 extending in the second direction 40 is also disposed in the region.

More specifically, in the example illustrated in FIGS. 9A to 9E, neither the first wiring layer M1 nor the second wiring layer M2 includes wiring laid to two-dimensionally connect both ends of the region including the pixel circuit 3000 for one pixel. However, the wiring is configured so that both ends of the region in the first direction 30 and both ends in the second direction 40 are connected by the combination of the first wiring layer M1 and the second wiring layer M2.

In the examples illustrated in FIGS. 7A to 7D and 8A to 8E, the first wiring layer M1 includes the wiring 1010 connecting both ends of the region including the pixel circuit 3000 for one pixel. The second wiring layer M2 also includes the wiring 1020 connecting both ends of the region including the pixel circuit 3000 for one pixel. However, as illustrated in FIGS. 9A to 9E, the wiring 1010 disposed on the first wiring layer M1 may be configured to be connected to either one of the ends of the region including the pixel circuit 3000 for one pixel and not to the other.

(Other Configuration Examples)

In the foregoing examples, the wiring of the voltage VDD (second voltage) is described. However, not only the wiring of the voltage VDD (second voltage) but also the wiring of the voltage VSS (third voltage) may be arranged as illustrated in FIGS. 7A to 7D to FIGS. 9A to 9E.

In the foregoing examples, the wiring of the voltage VDD (second voltage) is described to be laid on the first wiring layer M1 that is the closest wiring layer to the semiconductor layer of the second substrate 21 and the second wiring layer M2 that is the second closest. However, since the power supply wiring can be two-dimensionally laid out using a plurality of wiring layers, the power supply wiring may be two-dimensionally laid out using the third wiring layer M3 and the fourth wiring layer M4 closer to the first substrate 11 than the second wiring layer M2. Alternatively, the power supply wirings may be two-dimensionally laid out using all the first to third wiring layers M1 to M3.

In the foregoing examples, the wiring combined by the wiring layer group is two-dimensional wiring including two straight lines. However, the combined wiring may have a more complicated shape as long as the wiring is laid to reach both ends of the region including the pixel circuit 3000 for one pixel in the first direction 30 and both ends in the second direction 40 of the region.

In a second exemplary embodiment, an example where power supply wiring including the wiring of a voltage VDD (second voltage) and the wiring of a voltage VSS (third voltage) is two-dimensionally laid out by combining a plurality of wiring layers will be described. In the present exemplary embodiment, an example where the power supply wiring is two-dimensionally laid out by combining three wringing layers (wiring layer group) will be described.

(Wiring Configuration Example 2-1 of Plurality of Wiring Layers)

FIGS. 10A to 10D are diagrams illustrating a layout of the wiring of the voltage VDD (second voltage) and the voltage VSS (third voltage) illustrated in FIG. 4. As described with reference to FIG. 4, an APD sensor including SPADs includes a large number of circuits constituting a pixel circuit 3000 for each pixel. There is therefore a large amount of power supply wiring to the circuits and input and output wiring to/from the circuits, and the wiring density between the circuits is high. The higher the wiring density, the more likely the wiring of the voltage VDD (second voltage) and the voltage VSS (third voltage) serving as power supplies for the circuits is to be divided. This can hinder stable current supply.

FIGS. 10A to 10C illustrate a picked-out region where a pixel circuit 3000 for one pixel among pixel circuits 3000 included in a second substrate 21 is disposed.

FIG. 10A is a plan view illustrating a layout example of wiring 1110 of the voltage VDD (second voltage) and wiring 1115 of the voltage VSS (third voltage) disposed on a first wiring layer M1. In the region including the pixel circuit 3000 for one pixel, the wiring 1110 and 1115 is laid to extend in a second direction 40 to reach both ends of the region in the second direction 40. The reason is that the first wiring layer M1 includes wiring that connects circuits constituting the pixel circuit 3000 to each other as well as gate wiring at a high density, and the power supply wiring is unable to be laid to extend two-dimensionally.

FIG. 10B is a plan view illustrating a layout example of wiring 1120 of the voltage VDD (second voltage) and wiring 1125 of the voltage VSS (third voltage) disposed on a second wiring layer M2. The wiring 1120 and 1125 is laid to extend in a first direction 30 from one of the ends of the region and does not reach the other end of the region. The reason is that the second wiring layer M2 includes wiring that connects the circuits constituting the pixel circuit 3000 to each other as well as gate wiring at a high density, and the wiring 1120 and 1125 is unable to be laid to reach both ends of the region even if only one-dimensionally extended.

FIG. 10C is a plan view illustrating a layout example of wiring 1140 of the voltage VDD (second voltage) and wiring 1145 of the voltage VSS (third voltage) disposed on a third wiring layer M3. The wiring 1140 and 1145 is laid to extend in the first direction 30 from one of the ends of the region and does not reach the other end of the region. The reason is that the third wiring layer M3 includes wiring that connects the circuits constituting the pixel circuit 3000 to each other as well as gate wiring at a high density, and the wiring 1140 and 1145 is unable to be laid to reach both ends of the region even if only one-dimensionally extended.

As described above, none of the first, second, and third wiring layers M1, M2, and M3 can two-dimensionally lay out the power supply wiring by itself.

The second wiring layer M2 and the third wiring layer M3 are then used to constitute wiring that extends in the first direction 30 and reaches both ends of the region. Specifically, the wiring 1120 of the voltage VDD (second voltage) of the second wiring layer M2 and the wiring 1140 of the voltage VDD of the third wiring layer M3 are electrically connected by via wiring 1150. Similarly, the wiring 1125 of the voltage VSS (third voltage) of the second wiring layer M2 and the wiring 1145 of the voltage VSS of the third wiring layer M3 are electrically connected by via wiring 1155.

Moreover, the first to third wiring layers M1 to M3 are used to constitute wiring that extends in the first and second directions 30 and 40 and reaches both ends of the region. Specifically, the wiring 1110 of the voltage VDD (second voltage) of the first wiring layer M1 and the wiring 1120 of the voltage VDD of the second wiring layer M2 are electrically connected by via wiring 1130. Similarly, the wiring 1115 of the voltage VSS (third voltage) of the first wiring layer M1 and the wiring 1125 of the voltage VSS of the second wiring layer M2 are electrically connected by via wiring 1135.

With such a configuration, the power supply wiring can be two-dimensionally laid out by combining the first to third wiring layers M1 to M3. Suppose that a first pixel of high current consumption and a second pixel of low current consumption adjoin each other. In such a case, a current can be supplied from the power supply wiring of the pixel circuit 3000 of the second pixel to the pixel circuit 3000 of the first pixel if the consumption of the current through the power supply wiring of the pixel circuit 3000 of the first pixel is high. This enables stable current supply to the pixel circuits 3000.

(Wiring Configuration Example 2-2 of Plurality of Wiring Layers)

FIGS. 11D to 11I are diagrams illustrating wiring disposed on fourth and fifth wiring layers M4 and M5 that are wiring layers above the third wiring layer M3.

FIGS. 11A to 11C are similar to FIGS. 10A to 10C, and a description thereof will thus be omitted.

FIG. 11D is a diagram illustrating a layout example of wiring 1160 for supplying the voltage VSS (third voltage) and wiring 1165 for supplying the voltage VDD (second voltage) disposed on the fourth wiring layer M4. The wiring 1160 disposed on the fourth wiring layer M4 and the wiring 1145 disposed on the third wiring layer M3 are electrically connected by via wiring 1170.

FIG. 11F is a diagram similar to FIG. 11D. FIG. 11G illustrates four pixels in a mirror symmetric arrangement. The wiring 1160 disposed on the fourth wiring layer M4 connects both ends in the first direction 30 and the second direction 40 in a plan view within the fourth wiring layer M4 itself. The fourth wiring layer M4 is a wiring layer where the wiring of the voltage VSS (third voltage) has the largest occupation area among the plurality of wiring layers M1 to M5. The wiring width of the wiring for supplying the voltage VSS (third voltage) disposed on the fourth wiring layer M4 is thus increased to lower the resistance.

The distance between the fourth wiring layer M4 and the second semiconductor layer 402 where the pixel circuit 3000 is disposed is greater than the distance between any one of the first to third wiring layers M1 to M3 and the second semiconductor layer 402. The current supply from the pixel circuit 3000 of a pixel of low current consumption to the pixel circuit 3000 of a pixel of high current consumption can therefore be insufficient if the fourth wiring layer M4 is used alone. In view of this, in the present exemplary embodiment, the first to third wiring layers M1 to M3 are combined to two-dimensionally lay out the power supply wiring. This enables stable current supply to the pixel circuits 3000.

FIG. 11E is a diagram illustrating a layout example of wiring 1180 for supplying the voltage VDD (second voltage) disposed on the fifth wiring layer M5. The wiring 1180 disposed on the fifth wiring layer M5 and the wiring 1165 disposed on the fourth wiring layer M4 are electrically connected by via wiring 1190. The wiring 1165 disposed on the fourth writing layer M4 and the wiring 1140 on the third wiring layer M3 are electrically connected by via wiring 1175.

FIG. 11H is a diagram similar to FIG. 11E. FIG. 11I illustrates four pixels in a mirror symmetric arrangement. The wiring 1180 disposed on the fifth wiring layer M5 connects both ends in the first direction 30 and both ends in the second direction 40 in a plan view within the fifth wiring layer M5 itself. The fifth wiring layer M5 is a wiring layer where the wiring of the voltage VDD (second voltage) has the largest occupation area among the plurality of wiring layers M1 to M5. The wiring width of the wiring for supplying the voltage VDD (second voltage) disposed on the fifth wiring layer M5 is thus increased to lower the resistance.

The distance between the fifth wiring layer M5 and the second semiconductor layer 402 where the pixel circuit 3000 is disposed is greater than the distance between any one of the first to fourth wiring layers M1 to M4 and the second semiconductor layer 402. The current supply from the pixel circuit 3000 of a pixel of low current consumption to the pixel circuit 3000 of a pixel of high current consumption can therefore be insufficient if the fifth wiring layer M5 is used alone. In the present exemplary embodiment, the first to third wiring layers M1 to M3 are thus combined to two-dimensionally lay out the power supply wiring. This enables stable current supply to the pixel circuits 3000.

In the foregoing example, the fourth wiring layer M4 and the fifth wiring layer M5 are assigned as the wiring layers where the wiring occupation area of the respective two types of power supply voltages is the largest. In addition, the first to third wiring layers M1 to M3 are combined to two-dimensionally lay out the power supply wiring. Alternatively, the third wiring layer M3 and the fifth wiring layer M5 may be assigned as the wiring layers where the wiring occupation area of the respective two types of power supply voltages are the largest. In such a case, the first, second, and fourth wiring layers M1, M2, and M4 are combined to two-dimensionally lay out the power supply wiring.

In a third exemplary embodiment, a layout example of the pixel circuit 3000 described with reference to FIG. 4 will be described.

Figure 12A:
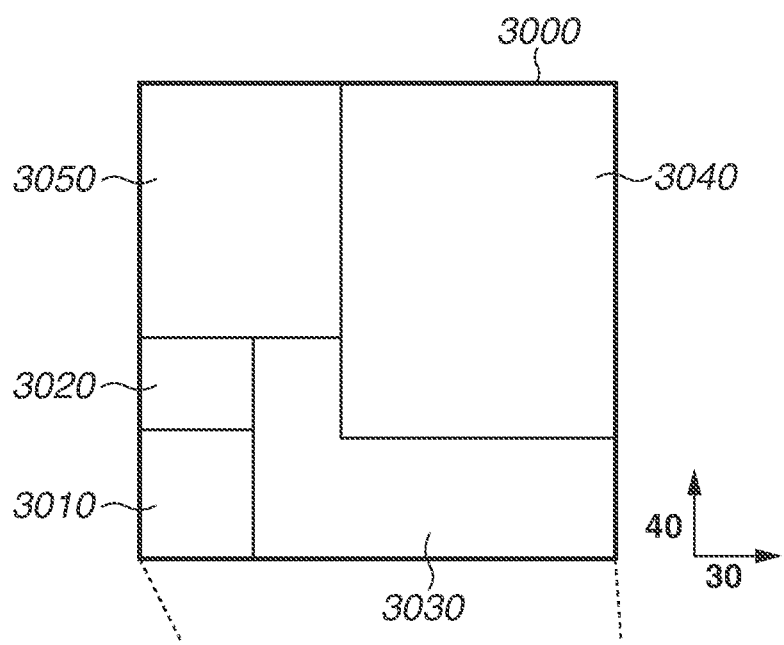
FIGS. 12A and 12B are diagrams illustrating a layout of pixel circuits according to a third exemplary embodiment.

FIG. 12A illustrates a layout example of a quenching element 3010 and a waveform shaping circuit 3020 included in a pixel circuit 3000 corresponding to a pixel. FIG. 12A also illustrates a layout example of a processing circuit 3030, a counter circuit 3040, and an output circuit 3050. The quenching element 3010 (such as a MOS transistor, and may thus also be referred to as a quenching circuit), the counter circuit 3040, and the output circuit 3050 are each located in contact with pixel edges. In other words, such circuits are located in contact with a border between a first pixel and a second pixel adjoining the first pixel. As employed herein, being in contact does not refer strictly to being in contact with a pixel edge or a border between pixels but refers to that no circuit having other functions is interposed between the pixel and the adjoining pixel. For example, it refers to that the closest circuit in the pixel circuit 3000 of the first pixel to the pixel circuit 3000 of the second pixel is the quenching element 3010, the counter circuit 3040, or the output circuit 3050 of the first pixel.

With such arrangement of the pixel circuits 3000, if an element or circuit in the pixel circuit 3000 of the first pixel consumes a lot of current, a current can easily be supplied from the wiring for supplying a voltage to the pixel circuit 3000 of the second pixel. This enables stable current supply to the pixel circuits 3000.

In FIG. 12A, the quenching element 3010 and the waveform shaping circuit 3020 are arranged next to each other. As illustrated in FIG. 4, one of the nodes of the MOS transistor that is the quenching element 3010 is electrically connected to the input node of the waveform shaping circuit 3020. The quenching element 3010 and the waveform shaping circuit 3020 are thus closely laid out to enjoy the advantage of reduced wiring capacitance.

Figure 12B:
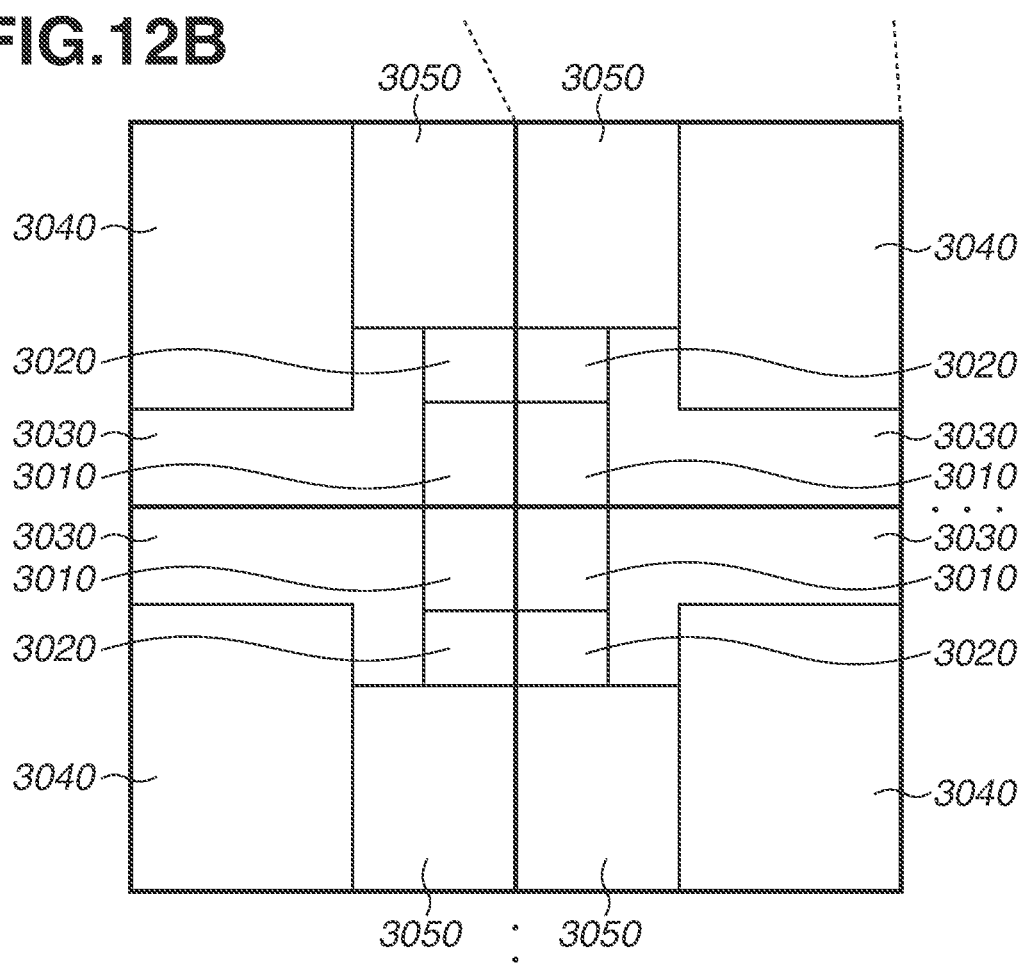

FIG. 12B illustrates a layout example of pixel circuits 3000 corresponding to four pixels. The pixel circuits 3000 of the pixels are in a mirror layout arrangement. The circuits having the same functions in the pixel circuits 3000 of the pixels are thus arranged next to each other. For example, if a first pixel (top right pixel) and a second pixel (not illustrated) are arranged next to each other in the first direction 30, the counter circuits 3040 of the first and second pixels adjoin each other. A first pixel (top left pixel) and a second pixel (top right pixel) are arranged so that the quenching elements 3010 and the waveform shaping circuits 3020 of the first and second pixels adjoin each other. In such a manner, the circuits can be laid out to save space.

Specifically, in FIG. 12A, the quenching element 3010 is located in a corner portion of the region including the pixel circuit 3000. The corner portion here refers to the corner formed by a first side of the region including the pixel circuit 3000 in the first direction 30 and a second side of the region in the second direction 40.

The corner portion also means that the region including the pixel circuit 3000 corresponding to one pixel is defined by the side in the first direction 30 and the side in the second direction 40 and the portion is located within ⅓ of the length of each side. For example, in FIG. 12A, the quenching element 3010 is located within ⅓ of the length of the horizontal side from the bottom left vertex and within ⅓ of the length of the vertical side from the bottom left vertex.

Suppose, for example, the quenching element 3010 is a PMOS transistor as illustrated in FIG. 4 and the transistors constituting the other circuits are N-channel MOS (NMOS) transistors. In such a case, the PMOS transistor and the NMOS transistors have well structures of respective different conductivity types. According to the layout example of FIG. 12B, the quenching elements 3010 of the four pixels can be closely located. An N well structure intended for a quenching element 3010 can thus be shared among the four pixels. As will be described below with reference to FIGS. 14A, 14B, and 15A to 15C, diffusion regions and power supply wiring (for example, contact wiring) can also be arranged to be shared between a plurality of pixels.

(Layout Example of Counter Circuit)

Figure 13A:
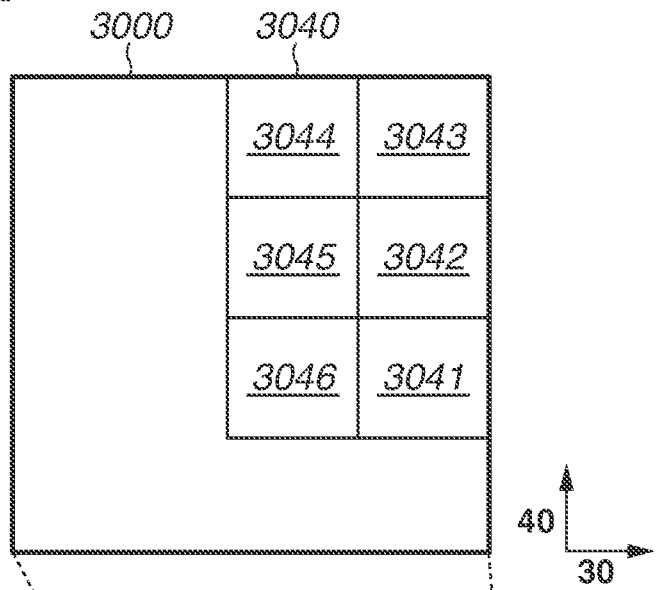
FIGS. 13A and 13B are diagrams illustrating a layout of pixel circuits according to the third exemplary embodiment.

FIG. 13A illustrates a pixel circuit 3000 corresponding to one pixel. With attention focused on the counter circuit 3040, the circuits other than the counter circuit 3040 are omitted. The counter circuit 3040 includes a first-bit circuit 3041. The counter circuit 3040 also includes second-, third-, fourth-, fifth-, and sixth-bit circuits 3042, 3043, 3044, 3045, and 3046. Since the illustrated counter circuit 3040 is a six-bit counter, the first bit is the least significant bit (LSB) and the sixth bit is the most significant bit (MSB).

Figure 13B:
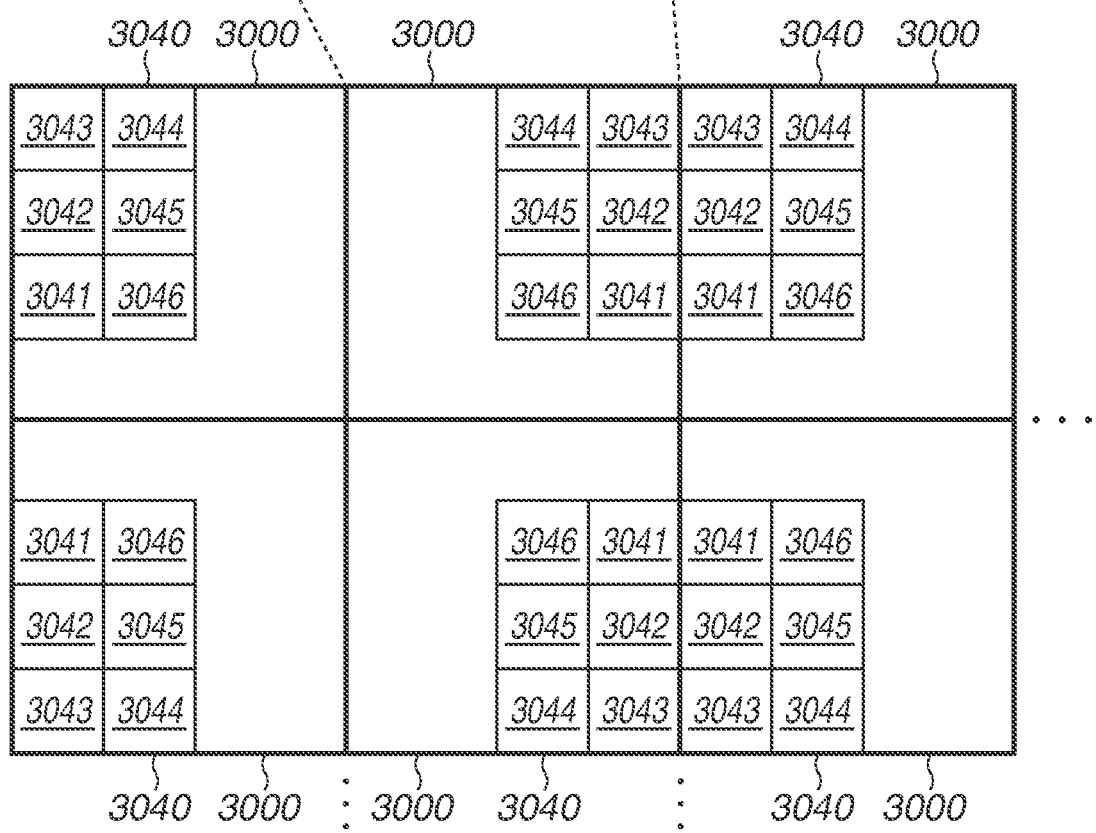

As illustrated in FIGS. 12A and 12B, the counter circuit 3040 occupies a larger region in the pixel circuit 3000 than the other circuits. For the purpose of signal processing, the first- to sixth-bit circuits 3041 to 3046 are desirably continuously arranged in the counter circuit 3040. As illustrated in FIGS. 13A and 13B, the first- to sixth-bit circuits 3041 to 3046 constituting the counter circuit 3040 are thus arranged to turn back halfway to save the space of the pixel circuit 3000. Specifically, the first-, second-, and third-bit circuits 3041, 3042, and 3043 are arranged in this order in the second direction 40. The fourth-bit circuit 3044 is arranged to adjoin the third-bit circuit 3043 in the first direction 30. The fourth-, fifth-, and sixth-bit circuits 3044, 3045, and 3046 are arranged in this order in a reverse direction to the second direction 40.

Suppose now that the first- to sixth-bit circuits 3041 to 3046 are arranged straight without the foregoing turn-back layout. In such a case, the region occupied by the pixel circuit 3000 has a vertically or horizontally oblong shape. This can result in a complicated wiring layout between a plurality of photoelectric conversion units 102 disposed on a first substrate 11 and the pixel circuits 3000 disposed to correspond to the photoelectric conversion units 102. By contrast, the layout illustrated in FIG. 13A can save the space of the pixel circuits 3000 and prevent complication of the wiring layout for electrically connecting the plurality of photoelectric conversion units 102 to the corresponding pixel circuits 3000.

FIG. 13B illustrates an example where the pixel circuits 3000 of two rows and three columns, a total of six pixels are laid out. In other words, FIG. 13B illustrates the layout of the pixel circuits 3000 when the third column is added to the pixel circuits 3000 of two rows and two columns, a total of four pixels illustrated in FIG. 12B.

Now, focus attention on the first-row second-column pixel circuit 3000 (pixel circuit 3000 of a first pixel) and the first-row third-column pixel circuit 3000 (pixel circuit 3000 of a second pixel) in FIG. 13B. The counter circuit 3040 of the first pixel is located in contact with edges of the first pixel. The counter circuit 3040 of the second pixel is located in contact with edges of the second pixel. More specifically, the counter circuits 3040 of the first and second pixels are located in contact with the border between the first and second pixels. As employed herein, being in contact does not refer strictly to being in contact with a pixel edge or a border between pixels but refers to that no circuit having other functions is interposed between the pixel and the adjoining pixel. For example, it refers to that no circuit other than the counter circuits 3040 is interposed between the counter circuits 3040 of the first and second pixels.

In FIG. 13B, the shortest distance between the first-bit circuit 3041 (LSB) of the first pixel and the first-bit circuit 3041 (LSB) of the second pixel is smaller than that between the sixth-bit circuit 3046 (MSB) of the first pixel and the sixth-bit circuit 3046 (MSB) of the second pixel. In a counter circuit 3040, the current consumption of the LSB circuit 3041 is higher than that of the MSB circuit 3046 since the LSB circuit 3041 is driven longer than the MSB circuit 3046. If the current consumption of the LSB circuit 3041 in the first pixel is high, a current can thus be supplied to the pixel circuit 3000 of the first pixel from the power supply wiring in the pixel circuit 3000 of the second pixel. By contrast, the current consumption of the MSB circuit 3046 in the first pixel is not high relative to that of the LSB circuit 3041, and such measures are therefore not necessarily needed.

The layout illustrated in FIG. 13B can be described as follows: The counter circuit 3040 of the first pixel and the counter circuit 3040 of the second pixel adjoining the first pixel are arranged in a mirror symmetric (line symmetric) manner. The LSB circuit 3041 of the first pixel and the LSB circuit 3041 of the second pixel are also arranged in a mirror symmetric manner. The shortest distance between the LSB circuit 3041 of the first pixel and the LSB circuit 3041 of the second pixel is smaller than that between the MSB circuit 3046 of the first pixel and the MSB circuit 3046 of the second pixel. Satisfying such a relationship enables more stable current supply to the pixel circuits 3000.

In a fourth exemplary embodiment, a layout where the quenching element 3010 in the pixel circuit 3000 described with reference to FIG. 4 includes a MOS transistor and a layout where the waveform shaping circuit 3020 includes an inverter will be described.

(Layout Example of Quenching Element)

Figure 14A:
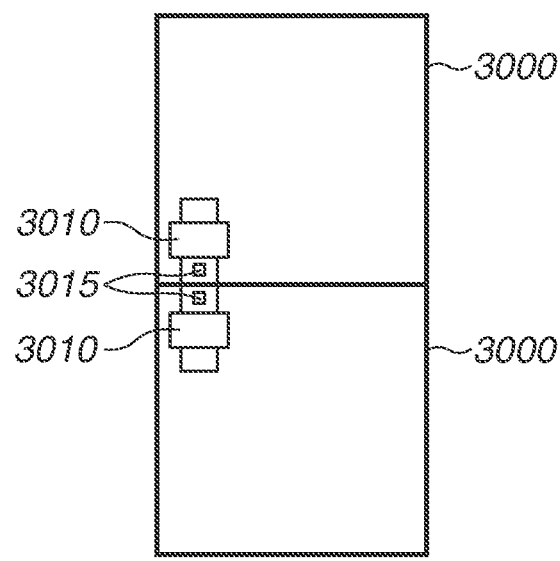
FIGS. 14A and 14B are diagrams illustrating a layout of pixel circuits according to a fourth exemplary embodiment.

FIG. 14A illustrates a layout diagram of the pixel circuits 3000 of two pixels in a plan view. With attention focused on the quenching elements 3010, the circuits other than the quenching elements 3010 are omitted. The first-row first-column circuit will be referred to as the pixel circuit 3000 of a first pixel, and the second-row first-column circuit will be referred to as the pixel circuit 3000 of a second pixel. The pixel circuit 3000 of the first pixel and the pixel circuit 3000 of the second pixel are arranged in a mirror symmetric (line symmetric) manner.

Figure 14B:
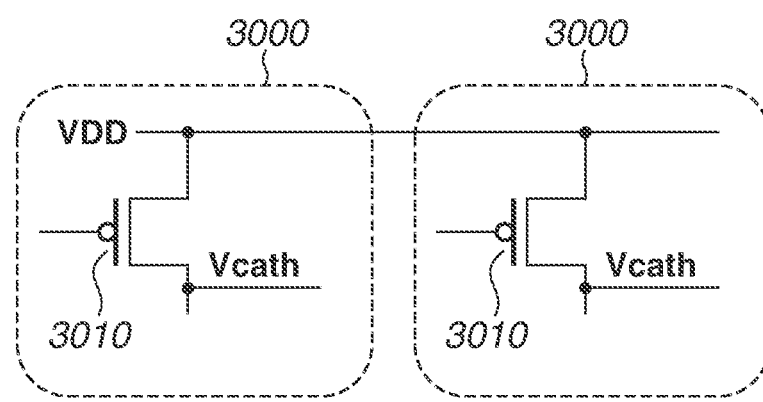

FIG. 14B is a circuit diagram of the quenching elements 3010 of the foregoing first and second pixels. As illustrated in the diagram, the voltage VDD (second voltage), a common voltage, is supplied to the sources of the PMOS transistors constituting the quenching elements 3010 of the two pixels.

Return to FIG. 14A. The PMOS transistor of the quenching element 3010 of the first pixel and the PMOS transistor of the quenching element 3010 of the second pixel share a single active region. Specifically, the diffusion region on the source sides of the PMOS transistors of the quenching elements 3010 is shared. Two pieces of contact wiring 3015 are disposed in the diffusion region.

Since the voltage VDD (second voltage) is supplied to the contact wiring 3015, the voltage VDD (second voltage) is also supplied to the sources of the PMOS transistors of the quenching elements 3010.

With such a configuration, a diffusion region that is the source or drain (in the case of an NMOS transistor, drain) of a MOS transistor serving as a quenching element 3010 can be shared between the pixel circuits 3000 of two pixels. This can save the space of the pixel circuits 3000.

In the foregoing description, two pieces of contact wiring are described to be connected to the shared diffusion region. However, the number of pieces of contact wiring may be one. Alternatively, three or more pieces of contact wiring may be provided. Sharing a single piece of contact wiring between two pixels can simplify layout.

(Layout Example of Waveform Shaping Circuit)

Figure 15A:
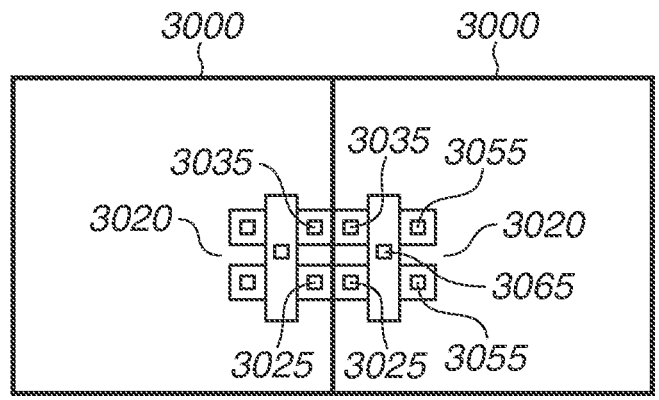
FIGS. 15A and 15C are diagrams illustrating a layout of pixel circuits according to the fourth exemplary embodiment.

FIG. 15A illustrates a layout diagram of the pixel circuits 3000 of two pixels in a plan view. With attention focused on the waveform shaping circuits 3020, the circuits other than the waveform shaping circuits 3020 are omitted. The first-row first-column circuit will be referred to as the pixel circuit 3000 of a first pixel, and the first-row second-column circuit as the pixel circuit 3000 of a second pixel. The pixel circuit 3000 of the first pixel and the pixel circuit 3000 of the second pixel are arranged in a mirror symmetric (line symmetric) manner.

Figure 15B:
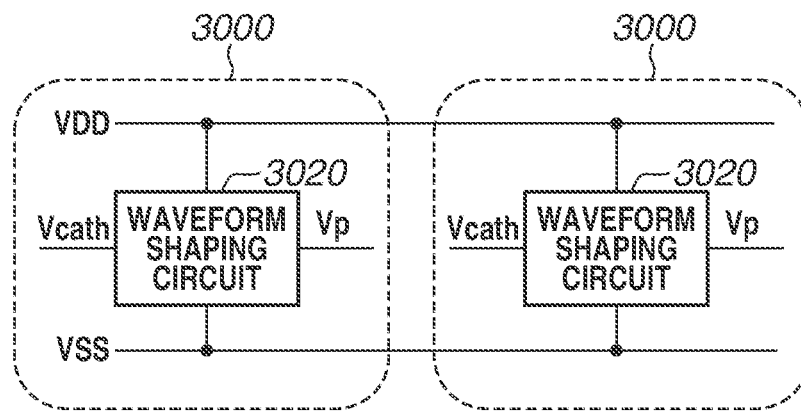

FIG. 15B illustrates a circuit diagram of the waveform shaping circuits 3020 of the foregoing first and second pixels. The voltage VDD (second voltage), a common voltage, is supplied to one side of the waveform shaping circuits 3020 of the two pixels. The voltage VSS (third voltage), a common voltage, is supplied to the other side of the waveform shaping circuit 3020 of the two pixels.

Figure 15C:
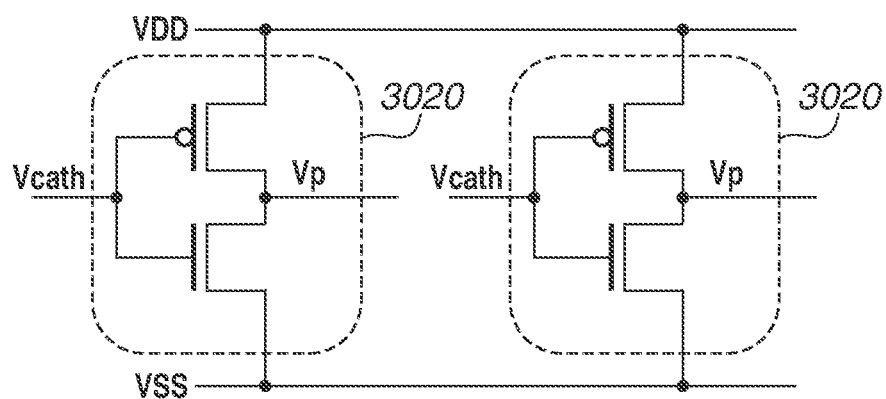

FIG. 15C is a circuit diagram illustrating the circuit configuration illustrated in FIG. 15B in more detail. Each waveform shaping circuit 3020 includes an inverter circuit including a PMOS transistor and an NMOS transistor. An input to the waveform shaping circuit 3020 is denoted by Vcath, and an output by Vp.

Return to FIG. 15A. Focus attention on the pixel circuit 3000 of the second pixel in the first row and the second column. The waveform shaping circuit 3020 included in the pixel circuit 3000 of the second pixel includes two transistors. One and the other of the transistors have a common gate. Contact wiring 3065 is connected to the gate. A voltage Vcath that is the input to the waveform shaping circuit 3020 is supplied to the contact wiring 3065. Contact wiring 3035 and contact wiring 3055 are connected to the source and drain of one of the transistors illustrated in FIG. 15A (for example, NMOS transistor), respectively. Similarly, contact wiring 3025 and contact wiring 3055 are connected to the source and drain of the other transistor (for example, PMOS transistor), respectively. The voltage VSS (third voltage) is supplied to the contact wiring 3035. The voltage VDD (second voltage) is supplied to the contact wiring 3025. A voltage Vp is output from the contact wiring 3055.

As illustrated in FIG. 15A, the contact wiring 3035 of the waveform shaping circuit 3020 of the first pixel and the contact wiring 3035 of the waveform shaping circuit 3020 of the second pixel are connected to a shared diffusion region.

Similarly, the contact wiring 3025 of the waveform shaping circuit 3020 of the first pixel and the contact wiring 3025 of the waveform shaping circuit 3020 of the second pixel are connected to a shared diffusion region.

With such a configuration, the diffusion region that is the source or drain of a transistor constituting a waveform shaping circuit 3020 can be shared between the pixel circuits 3000 of two pixels. This can save the space of the pixel circuits 3000.

In the foregoing configuration, the two pieces of contact wiring (for example, two pieces of contact wiring 3025 or two pieces of contact wiring 3035) are disposed in a shared diffusion region. However, the two pieces of contact wiring may be integrated into one and disposed in the shared diffusion region.

In a fifth exemplary embodiment, a configuration and a wiring layout of a photoelectric conversion apparatus for performing anti-pileup clock driving will be described.

Figure 16A:
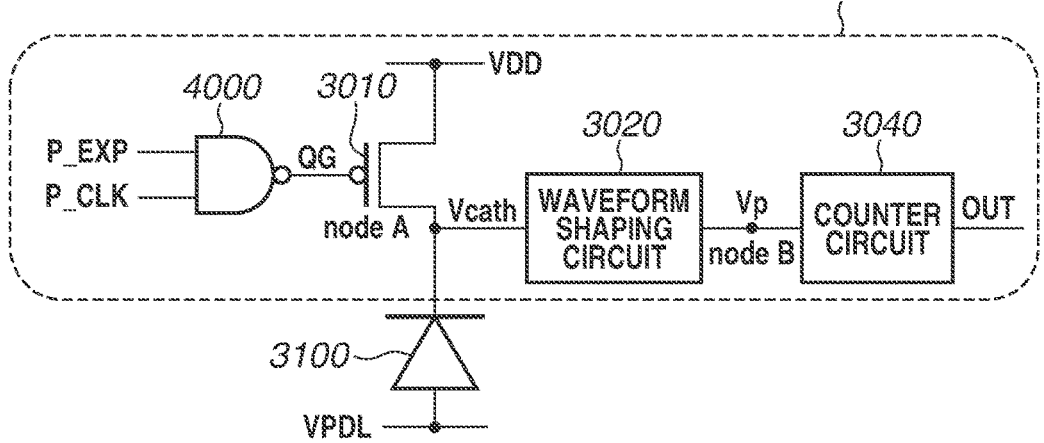
FIGS. 16A to 16C are diagrams illustrating a configuration and a wiring layout of a photoelectric conversion apparatus according to a fifth exemplary embodiment.

FIG. 16A illustrates an APD 3100 and a pixel circuit 3000 in performing the clock driving.

FIG. 16A illustrates a quenching element 3010, a waveform shaping circuit 3020, a counter circuit 3040, and a signal generation circuit 4000 of the pixel circuit 3000. The other circuits of the pixel circuit 3000 are omitted.

A quenching operation and a recharging operation using the quenching element 3010 can be performed based on avalanche multiplication by the APD 3100. However, a photon can fail to be determined as an output signal depending on its detection timing. For example, suppose that the APD 3100 causes avalanche multiplication, the input potential of node A is turned to a low level, and a recharging operation is being performed. In general, the determination threshold of the waveform shaping circuit 3020 is set to a potential higher than the potential difference at which the APD 3100 causes avalanche multiplication. If a photon is incident when the potential of node A is lower than the determination threshold due to the recharging operation and capable of avalanche multiplication by the APD 3100, the APD 3100 causes avalanche multiplication and the voltage of node A drops. Since the potential of node A drops from the voltage lower than the determination threshold, the output potential of node B does not change despite the detection of the photon. In other words, the detected photon is not determined as a signal despite the occurrence of the avalanche multiplication. Photons are particularly less likely to be detected as a signal at high luminance since the photons are successively incident in a short period. The actual number of incident photons and the output signal thus tend to have a large discrepancy at high luminance. Such a phenomenon may be called a pileup phenomenon.

In view of this, as illustrated in FIG. 16A, the quenching element 3010 constituted by a PMOS transistor is turned on and off using a control signal QG so that photons successively incident on the APD 3100 in a short period can be determined as signals.

The signal generation circuit 4000 includes a logic circuit. Here, the signal generation circuit 4000 includes a NAND circuit, to which a control signal P_EXP for controlling an exposure period and a control signal P_CLK are input. If the two control signals P_EXP and P_CLK are "1", the logic circuit outputs "0". This output is the control signal QG. On the other hand, if at least either one of the two control signals P_EXP and P_CLK is "0", the logic circuit outputs "1". If the control signal QG is "0", the quenching element 3010 that is a PMOS transistor turns on. If the control signal QG is "1", the quenching element 3010 that is a PMOS transistor turns off.

Figure 16B:
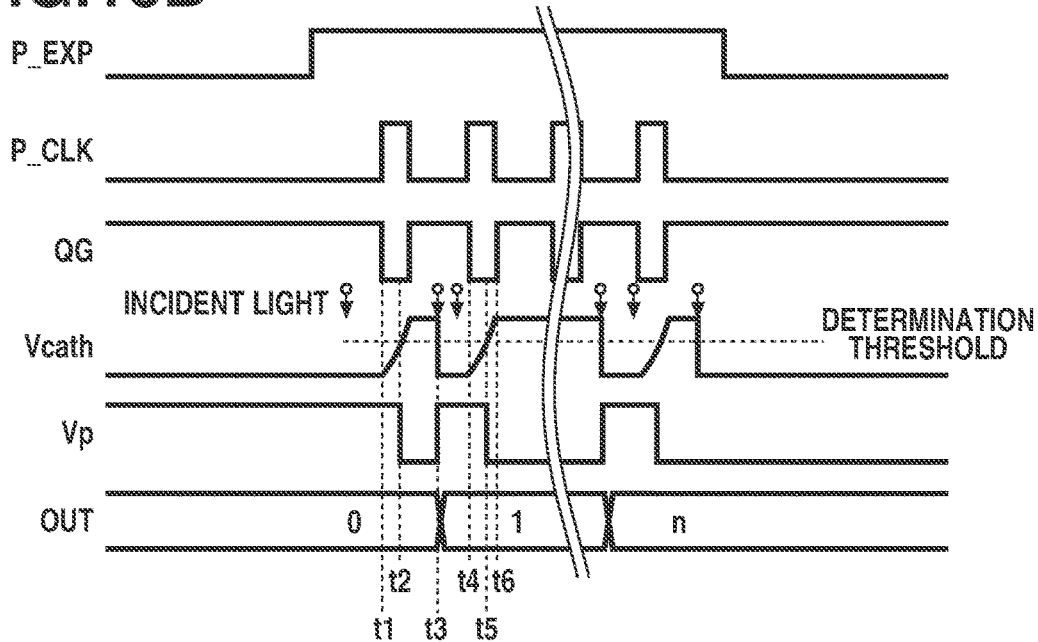

Referring to the pulse chart of FIG. 16B, if the control signal P_EXP is at a high level ("1") and the control signal P_CLK is at a high level ("1"), the control signal QG becomes a low level ("0") and the PMOS transistor that is the quenching element 3010 turns on. With the quenching element 3010 on, the PMOS transistor has a low resistance and a recharging operation is performed. On the other hand, if at least either one of the control signals P_EXP and P_CLK is at a low level, the control signal QG becomes a high level and the PMOS transistor that is the quenching element 3010 turns off. With the quenching element 3010 off, the PMOS transistor has a high resistance and a recharging operation becomes less likely to be performed. This stops the avalanche multiplication operation of the APD 3100.

At time t1, the control signal QG transitions from the high level to the low level. The quenching element 3010 turns on, and the ADP 3100 starts a recharging operation. As a result, the voltage Vcath at the cathode (node A) of the APD 3100 transitions to a high level. This makes the potential difference between the potentials applied to the anode and cathode of the APD 3100 capable of avalanche multiplication. The voltage Vcath transitioning from the low level to the high level reaches or exceeds the determination threshold at time t2. Here, the pulse signal output from the output Vp (node B) is reversed from a high level to a low level. A potential difference capable of avalanche multiplication is subsequently applied to the APD 3100. The control signal QG then transitions from the low level to the high level, and the switch (quenching element 3010) turns off.

At time t3, the incidence of a photon causes avalanche multiplication in the APD 3100. An avalanche multiplication current flows through the quenching element 3010 and the voltage Vcath drops. The amount of voltage drop increases further, and the voltage difference applied across the APD 3100 decreases. The avalanche multiplication in the APD 3100 stops like time t2, and the voltage Vcath stops dropping beyond a certain voltage level. If the dropping voltage Vcath falls below the determination threshold, the voltage Vp changes from the low level to the high level. In other words, the portion of the output waveform of the voltage Vcath beyond the determination threshold is shaped by the waveform shaping circuit 3020 and output as a signal from node B. The signal is counted by the counter circuit 3040, whereby the count value of a counter signal output from the counter circuit 3040 is incremented by one LSB.

While a photon is incident on APD 3100 between times t3 and t4, the voltage applied to the APD 3100 does not have a potential difference capable of avalanche multiplication since the control signal QG is at the high level and the quenching element 3010 is off. The voltage level of the voltage Vcath therefore does not exceed the determination threshold.

At time t4, the control signal QG changes from the high level to the low level, and the quenching element 3010 turns on. A current compensating the voltage drop flows through node A accordingly, and the voltage Vcath transitions toward the original voltage level. At time t5, the voltage Vcath reaches or exceeds the determination threshold, and the pulse signal on the output Vp is reversed from the high level to the low level.

At time t6, the voltage Vcath stabilizes at the original voltage level, and the control signal QG changes from the low level to the high level. This turns off the quenching element 3010. Subsequently, the potentials of the nodes and the signal lines change based on the control signal QG and the incidence of a photon as described at times t1 to t6.

As described above, the recharging operation is performed at predetermined periods based on the control signal QG. In periods where the APD 3100 is not recharged, photons are not counted. If photons are successively incident in a short period, the first photon is thus determined as a signal and the others are not counted. In the example of FIG. 16B, the photon incident at time t3 is counted, and the photon incident between times t3 and t4 is not. If the control signal QG is clock-driven as illustrated in FIG. 16B, the number of times the control signal QG turns off in a predetermined exposure period where the control signal P_EXP is on defines the upper limit of the number of photons that can be counted. With such a configuration, the phenomenon that the actual number of incident photons and the output signal are likely to have a discrepancy despite high luminance can be reduced.

Figure 16C:
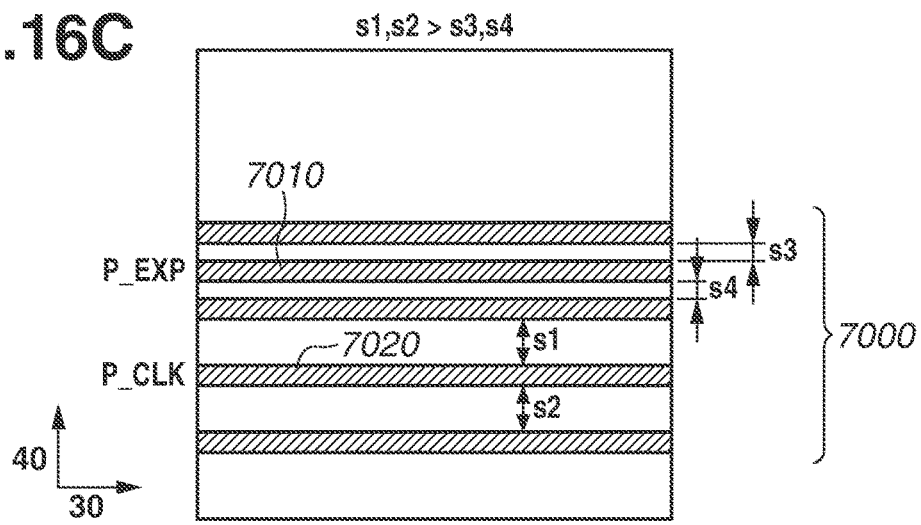

FIG. 16C is a diagram illustrating a layout of a signal wiring group 7000 including wiring for transmitting the control signal P_EXP and wiring for transmitting the control signal P_CLK. FIG. 16C is a plan view of a predetermined wiring layer extracted from the wiring layers for the pixel circuit 3000 of a pixel. Wiring 7010 for the control signal P_EXP and wiring 7020 for the control signal P_CLK are laid to extend in a first direction 30. Other pieces of wiring, though not denoted by reference numerals, are also laid to extend in the first direction 30.

As illustrated in FIG. 16B, the control signal P_CLK transitions a plurality of times while the control signal P_EXP is at the high level. The control signal P_CLK thus has a frequency higher than that of the control signal P_EXP. In view of mutual capacitive coupling of the wiring, a distance between wiring of high frequency and adjoining wiring is desirably greater than that between wiring of low frequency and adjoining wiring. Specifically, a distance between the wiring 7020 for the control signal P_CLK and adjoining wiring is desirably greater than that between the wiring 7010 for the control signal P_EXP and adjoining wiring.

FIG. 16C is a layout diagram illustrating the control signal wiring and other signal wiring. Distances between the wiring 7020 for the control signal P_CLK and the wiring adjoining the wiring 7020 are s1 and s2. Distances between the wiring 7010 for the control signal P_EXP and the wiring adjoining the wiring 7010 are s3 and s4. There holds s1>s3 and s4, and s2>s3 and s4. Such a layout of the control signal wiring on the wiring layer can suppress the mutual capacitive coupling of the wiring and reduce the effect of the turning on and off of the control signal P_CLK on other wiring.

In a sixth exemplary embodiment, like the fifth exemplary embodiment, a configuration and a wiring layout of a clock-driven photoelectric conversion apparatus will be described.

Figure 17A:
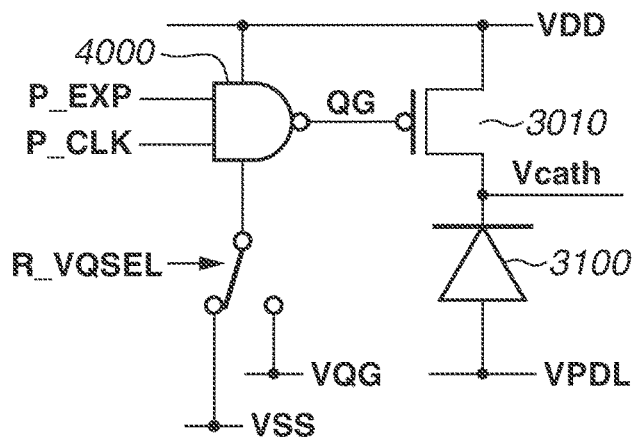
FIGS. 17A to 17C are diagrams illustrating a configuration and a wiring layout of a photoelectric conversion apparatus according to a sixth exemplary embodiment.

FIG. 17A illustrates a circuit example for the case of performing clock driving. A description of circuits similar to those in the fifth exemplary embodiment will be omitted. A waveform shaping circuit 3020 and a counter circuit 3040 are similar to those in FIG. 16A and are therefore omitted from the diagram.

FIGS. 17A and 16A will be compared. In FIG. 17A, the power supply voltage to be input to the signal generation circuit 4000 can be selected from between the voltage VSS (third voltage) and a voltage VQG (fourth voltage). The voltage VSS (third voltage) and the voltage VQG (fourth voltage) can be switched by a control signal R_VQSEL. The control signal R_VQSEL can make the low-level voltage of the control signal QG variable.

Figure 17B:
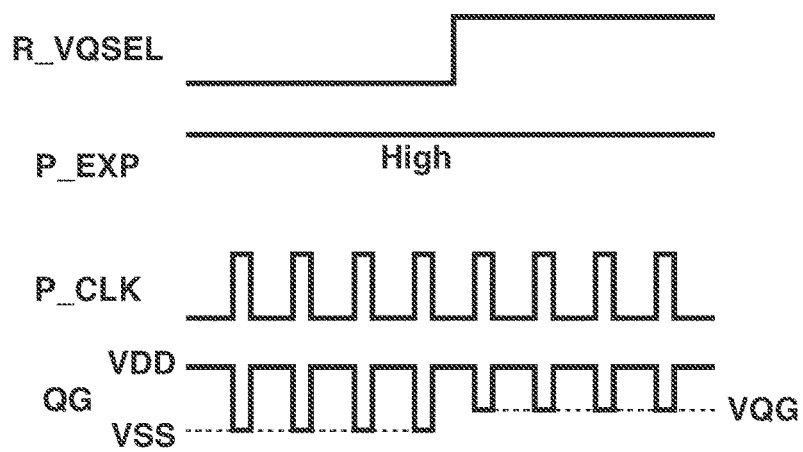

FIG. 17B is a pulse chart illustrating an example of a part of the state where the control signal P_EXP is at the high level in the pulse chart of FIG. 16B. In FIG. 17B, if the control signal R_VQSEL is at a low level, the signal generation circuit 4000 is connected to the voltage VSS (third voltage). Since the control signal P_EXP is at the high level, the control signal QG becomes a high level and the PMOS transistor that is a quenching element 3010 turns off when the control signal P_CLK is at the low level. The high-level voltage of the control signal QG is the voltage VDD (second voltage). When the control signal P_CLK is at the high level, the control signal QG becomes a low level and the PMOS transistor that is the quenching element 3010 turns on since the control signal P_EXP is at the high level. The low-level voltage of the control signal QG is the voltage VSS (third voltage).

The control signal R_VQSEL then transitions from the low level to a high level. In such a case, the high-level voltage of the control signal QG is the voltage VDD (second voltage) as described above, and the low-level voltage of the control signal QG is VQG (fourth voltage).

Since the voltage input to the gate of the quenching element 3010 that is a PMOS transistor is variable, the resistance of the quenching element 3010 is variable. Specifically, the resistance of the quenching element 3010 when the voltage VSS (third voltage) is applied to the gate is lower than that of the quenching element 3010 when the voltage VQG (fourth voltage) is applied to the gate. The recharging time when the low-level voltage of the control signal QG is set to the voltage VSS (third voltage) is thus shorter than that when the low-level voltage of the control signal QG is set to the voltage VQG (fourth voltage). For example, in FIG. 16B, the voltage Vcath completes recharging at timing when the control signal QG returns from the low level to the high level. If, for example, the voltage VSS (third voltage) has too low a value as the gate voltage of the quenching element 3010, the resistance of the quenching element 3010 becomes low and the time to complete recharging decreases. As a result, the recharging is completed before the control signal QG returns from the low level to the high level. If a photon is incident at such timing, avalanche multiplication occurs. Recharging can even be completed again before the control signal QG returns from the low level to the high level, and the incidence of another photon can cause the second round of avalanche multiplication. In such a case, avalanche multiplication can thus occur twice before the control signal QG returns from the low level to the high level. In other words, for a single pulse of the control signal P_CLK, avalanche multiplication occurs twice or more with useless power consumption. Such a phenomenon can occur at high luminance in particular. The variable recharging time has the advantage that the power consumption during a predetermined exposure period can be averaged to eventually reduce the power consumption.

In FIG. 17B, the voltage VSS (third voltage) and the voltage VQG (fourth voltage) are switched during an exposure period. However, the voltage VSS (third voltage) may be used in a first exposure period, and the voltage VQG (fourth voltage) in a second exposure period different from the first exposure period. Depending on a mode setting, light detection may be performed using only the voltage VSS (third voltage) or using only the voltage VQG (fourth voltage).

Figure 17C:
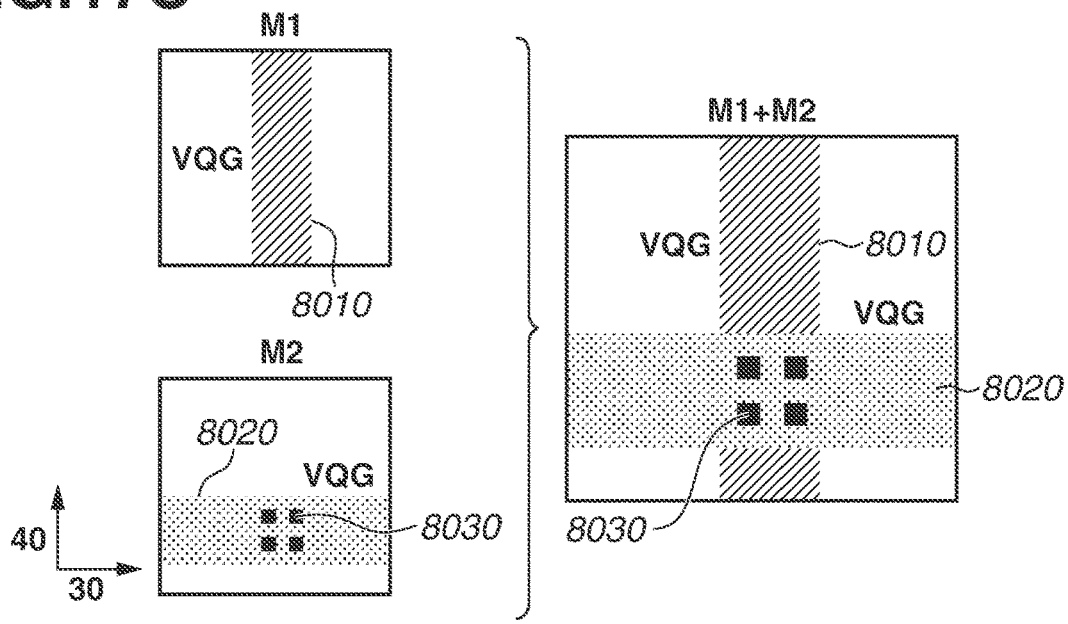

FIG. 17C is a layout diagram illustrating wiring for supplying the voltage VQG in a region where the pixel circuit 3000 for one pixel is disposed. As described above, the voltage VQG is a voltage for determining the recharging time. To reduce the influence from other signal wiring, the wiring for supplying the voltage VQG is desirably laid out to reduce resistance. Specifically, the wiring can be laid out two-dimensionally or with a large wiring width in a plan view. However, as described above, the APD sensor including SPADs includes a large number of circuits constituting the pixel circuits 3000 provided for respective pixels. There is therefore a large amount of power supply wiring to the circuits and input and output wiring to/from the circuits, and the wiring density between the circuits is high. As the wiring density increases, the wiring to reduce the resistance becomes more likely to be divided and more difficult to lay out two-dimensionally using only one wiring layer. Moreover, as the wiring density increases, the space for increasing the wiring width becomes more difficult to secure.

In view of this, as illustrated in FIG. 17C, wiring 8010 of the voltage VQG (fourth voltage) is extended in a second direction 40 on a first wiring layer M1. The wiring 8010 is laid to reach both ends of the region where the pixel circuit 3000 for one pixel is disposed. In addition, wiring 8020 of the voltage VQG (fourth voltage) is extended in a first direction 30 on a second wiring layer M2. The wiring 8020 is also laid to reach both ends of the region. The wiring 8010 and the wiring 8020 are electrically connected by via wiring 8030. The power supply wiring can thereby be two-dimensionally laid out with a reduction in the influence from other wiring. This enables stable recharging operations.

The ratio of the area occupied by the wiring for supplying the voltage VQG (fourth voltage) in the wiring layers of the region where the pixel circuit 3000 for one pixel is disposed is ⅕ or more, for example. Such a large wiring width can lower the resistance and stable recharging operations are possible by reducing the influence from other wiring.

In the foregoing description, the wiring for supplying the voltage VQG (fourth voltage) is disposed on the first wiring layer M1 and the second wiring layer M2. However, the wiring may be disposed on other wiring layers. For example, as illustrated in FIGS. 11A to 11I, the wiring of the voltages VSS and VDD is two-dimensionally laid out using the combination of the first to third wiring layers M1 to M3. The wiring of the voltage VQG then may be two-dimensionally laid out using the combination of the fourth and fifth wiring layers M4 and M5.

Figure 18:
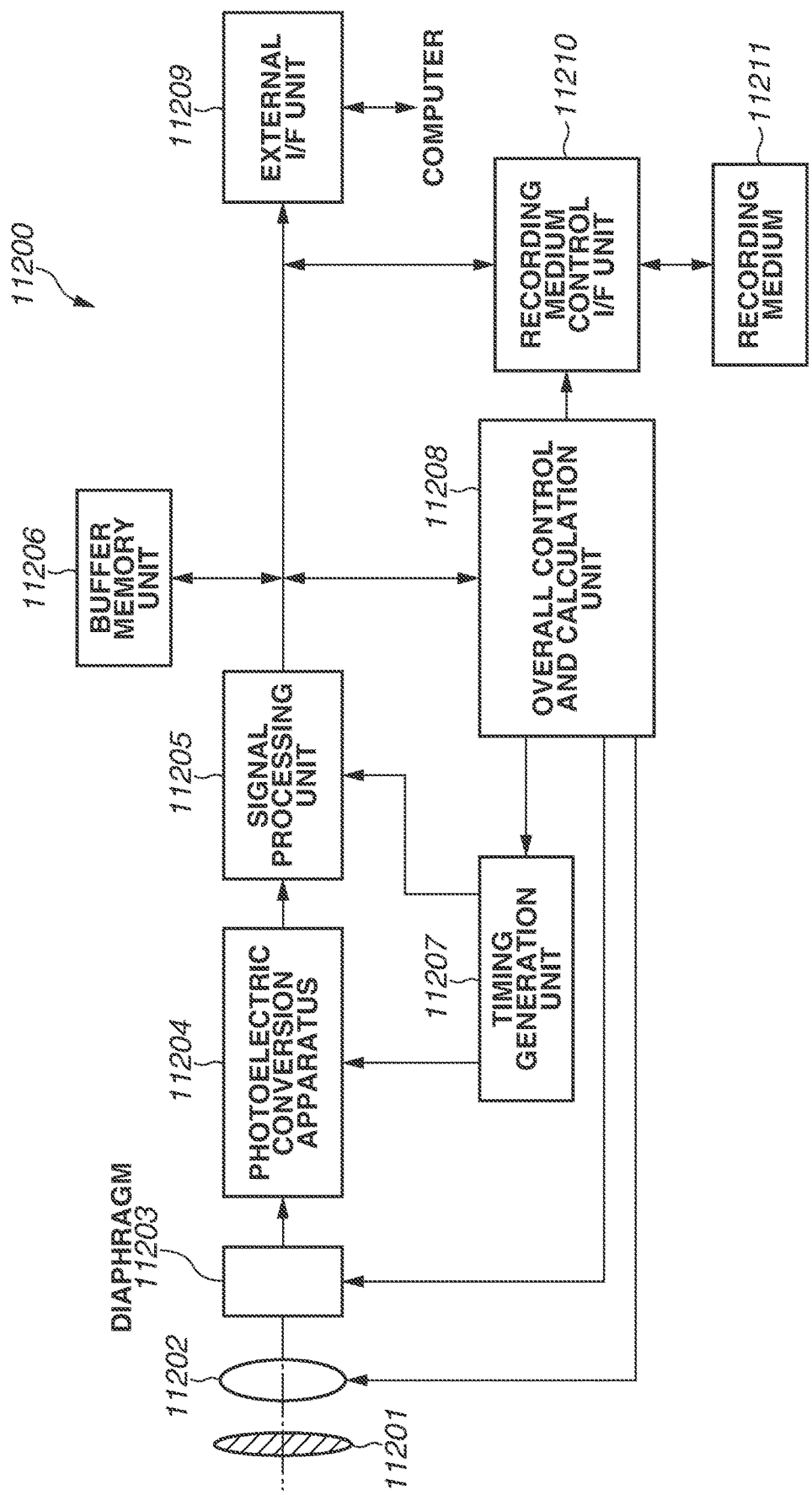
FIG. 18 is a functional block diagram of a photoelectric conversion system according to a seventh exemplary embodiment.

FIG. 18 is a block diagram illustrating a photoelectric conversion system 11200 according to a seventh exemplary embodiment. The photoelectric conversion system 11200 according to the present exemplary embodiment includes a photoelectric conversion apparatus 11204. Any one of the photoelectric conversion apparatuses described in the foregoing exemplary embodiments can be applied to the photoelectric conversion apparatus 11204. The photoelectric conversion system 11200 can be used as an imaging system, for example. Specific examples of the imaging system include a digital still camera, a digital camcorder, and a surveillance camera. FIG. 18 illustrates an example of a digital still camera as the photoelectric conversion system 11200.

The photoelectric conversion system 11200 illustrated in FIG. 18 includes the photoelectric conversion apparatus 11204 and a lens 11202 that forms an optical image of an object on the photoelectric conversion apparatus 11204. The photoelectric conversion system 11200 also includes a diaphragm 11203 for adjusting the amount of light passing through the lens 11202, and a barrier 11201 for protecting the lens 11202. The lens 11202 and the diaphragm 11203 constitute an optical system for collecting light to the photoelectric conversion apparatus 11204.

The photoelectric conversion system 11200 includes a signal processing unit 11205 that processes an output signal output from the photoelectric conversion apparatus 11204. The signal processing unit 11205 performs signal processing operations for making various corrections to the input signal and compressing the input signal as appropriate, and outputting the resulting signal. The photoelectric conversion system 11200 further includes a buffer memory unit 11206 for temporarily storing image data, and an external interface (I/F) unit 11209 for communicating with an external computer. The photoelectric conversion system 11200 further includes a recording medium 11211 such as a semiconductor memory for recording and reading captured image data, and a recording medium control I/F unit 11210 for performing recording and reading on the recording medium 11211. The recording medium 11211 may be built in or detachably attachable to the photoelectric conversion system 11200. Communication from the recording medium control I/F unit 11210 to the recording medium 11211 and communication from the external I/F unit 11209 may be performed in a wireless manner.

The photoelectric conversion system 11200 further includes an overall control and calculation unit 11208 that performs various calculations and controls the entire digital still camera, and a timing generation unit 11207 that outputs various timing signals to the photoelectric conversion apparatus 11204 and the signal processing unit 11205. Timing signals may be input from outside. The photoelectric conversion system 11200 may include at least the photoelectric conversion apparatus 11204 and the signal processing unit 11205 that processes the output signal output from the photoelectric conversion apparatus 11204. The overall control and calculation unit 11208 and the timing generation unit 11207 may be configured to perform part or all of control functions of the photoelectric conversion apparatus 11204.

The photoelectric conversion apparatus 11204 outputs an image signal to the signal processing unit 11205. The signal processing unit 11205 applies predetermined signal processing to the image signal output from the photoelectric conversion apparatus 11204, and outputs image data. The signal processing unit 11205 generates an image from the image signal. The signal processing unit 11205 may perform distance measurement calculations on the signal output from the photoelectric conversion apparatus 11204. The signal processing unit 11205 and the timing generation unit 11207 may be implemented in the photoelectric conversion apparatus 11204. In other words, the signal processing unit 11205 and the timing generation unit 11207 may be disposed on a substrate where pixels are arranged or on another substrate. An imaging system capable of obtaining images of higher quality can be implemented by constituting the imaging system using one of the photoelectric conversion apparatuses according to the foregoing exemplary embodiments.

Figure 19:
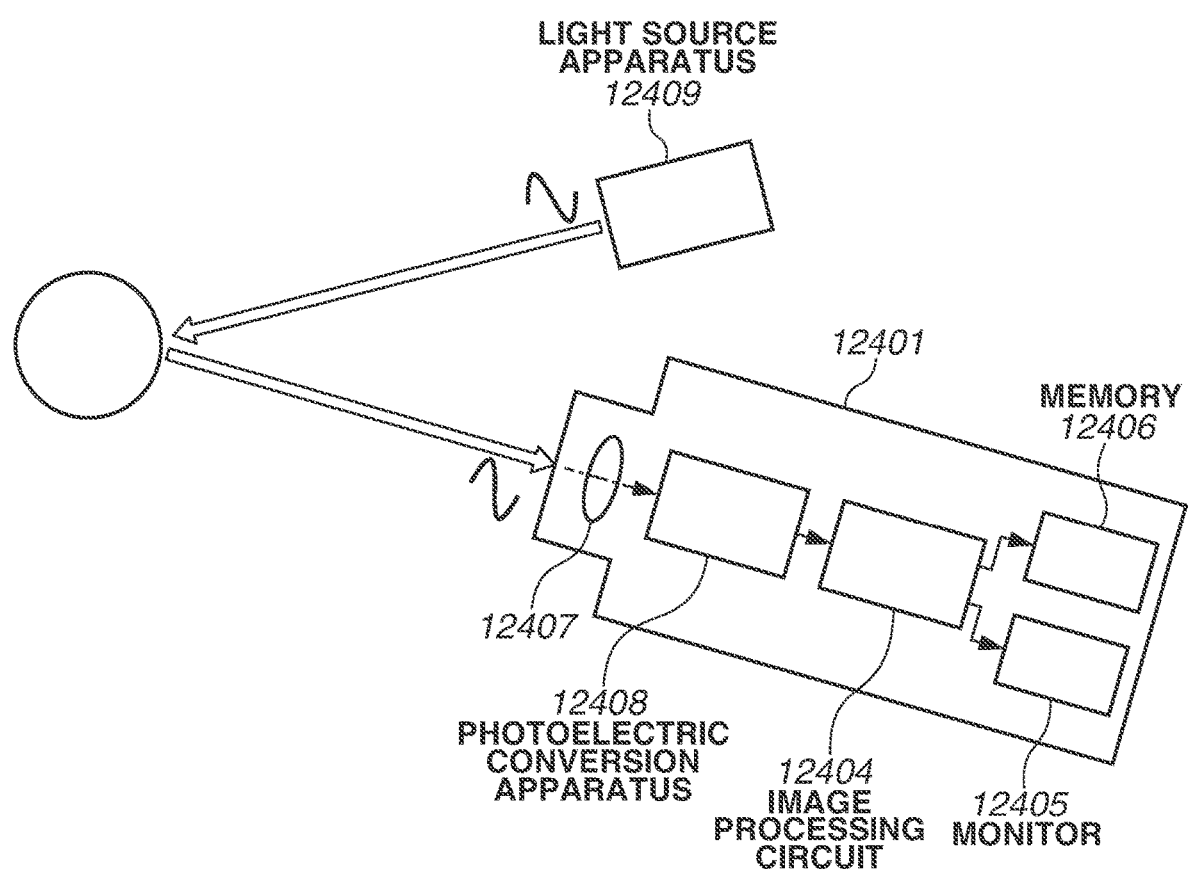
FIG. 19 is a functional block diagram of a distance sensor according to an eighth exemplary embodiment.

An eighth exemplary embodiment will be described. FIG. 19 is a block diagram illustrating a configuration example of a distance image sensor that is an electronic device using one of the photoelectric conversion apparatuses according to the foregoing exemplary embodiments.

As illustrated in FIG. 19, a distance image sensor 12401 includes an optical system 12407, a photoelectric conversion apparatus 12408, an image processing circuit 12404, a monitor 12405, and a memory 12406. The distance image sensor 12401 can obtain a distance image based on a distance to an object by receiving light (modulated light or pulsed light) that is projected from a light source apparatus 12409 to the object and reflected from the surface of the object.

The optical system 12407 includes one or a plurality of lenses. The optical system 12407 guides the image light (incident light) from the object to the photoelectric conversion apparatus 12408 and forms an image on a light reception surface (sensor unit) of the photoelectric conversion apparatus 12408.

One of the photoelectric conversion apparatuses according to the foregoing exemplary embodiments is applied to the photoelectric conversion apparatus 12408. A distance signal indicating a distance determined from a light reception signal output from the photoelectric conversion apparatus 12408 is supplied to the image processing circuit 12404.

The image processing circuit 12404 performs image processing for constructing a distance image based on the distance signal supplied from the photoelectric conversion apparatus 12408. The distance image (image data) obtained by the image processing is supplied to and displayed on the monitor 12405, or supplied to and stored (recorded) in the memory 12406.

The application of the foregoing photoelectric conversion apparatus 12408 enables the distance image sensor 12401 configured thus to, for example, obtain a more accurate distance image due to improved pixel characteristics.

A ninth exemplary embodiment will be described. A technique according to the present exemplary embodiment (present technique) can be applied to various products. For example, the technique according to the present exemplary embodiment may be applied to an endoscopic surgery system.

Figure 20:
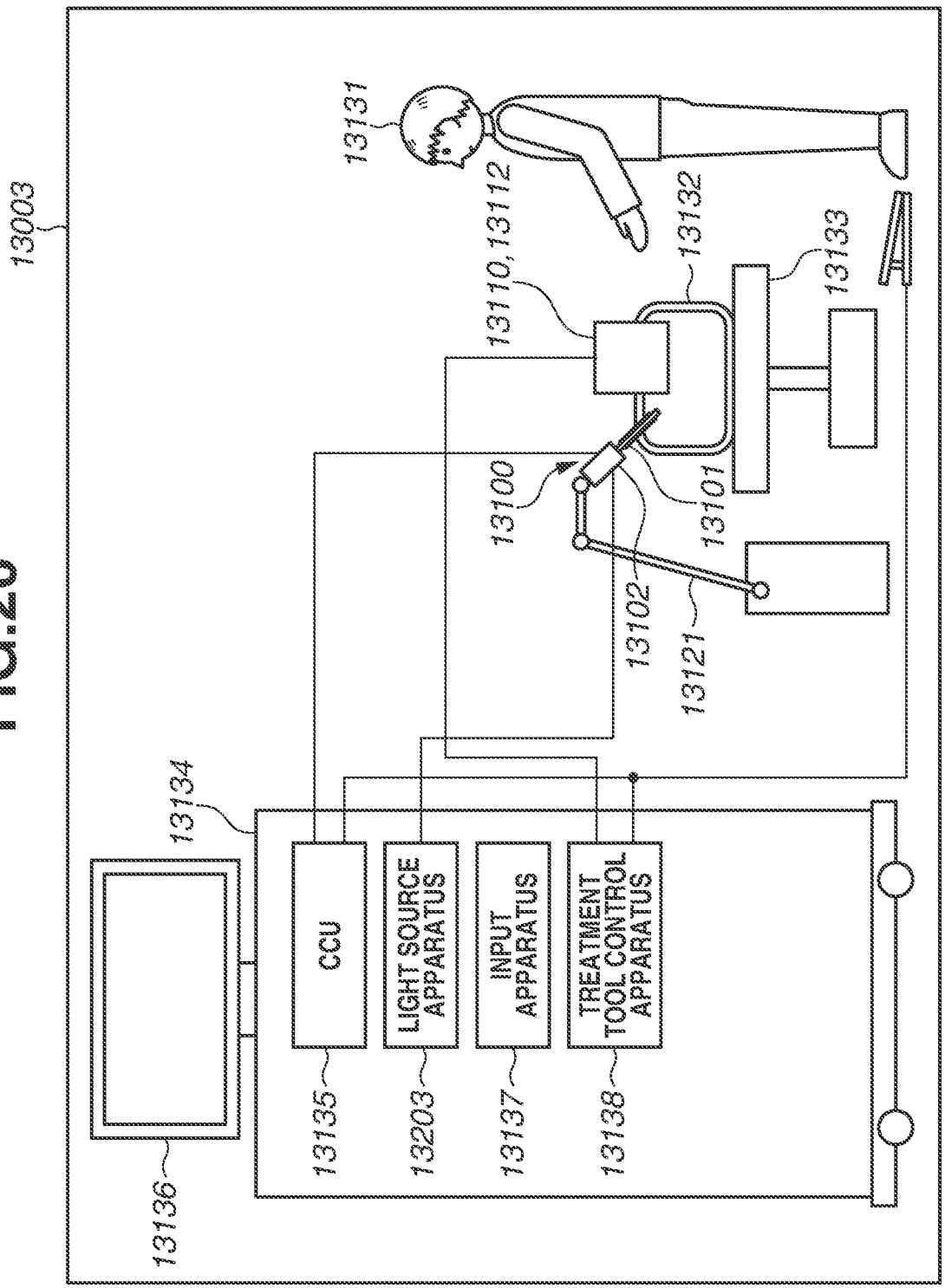
FIG. 20 is a functional block diagram of an endoscopic surgery system according to a ninth exemplary embodiment.

FIG. 20 is a diagram illustrating an example of a schematic configuration of an endoscopic surgery system to which the technique according to the present exemplary embodiment (present technique) can be applied.

FIG. 20 illustrates a state where an operator (doctor) 13131 is performing surgery on a patient 13132 on a patient bed 13133 using an endoscopic surgery system 13003. As illustrated in the diagram, the endoscopic surgery system 13003 includes an endoscope 13100, an operation tool 13110, and a cart 13134 on which various apparatuses for endoscopic surgery are mounted.

The endoscope 13100 includes a lens barrel 13101 to be inserted into a body cavity of the patient 13132 as much as a predetermined length from its tip, and a camera head 13102 connected to the bottom of the lens barrel 13101. In the illustrated example, the endoscope 13100 is configured as a rigid endoscope including a rigid lens barrel 13101. However, the endoscope 13100 may be configured as a soft endoscope including a soft lens barrel.

The lens barrel 13101 has an opening in which an objective lens is fitted at the tip. A light source apparatus 13203 is connected to the endoscope 13100. Light generated by the light source apparatus 13203 is guided to the tip of the lens barrel 13101 by a light guide extended through the lens barrel 13101. The light is projected toward an observation target in the body cavity of the patient 13132 through the objective lens. The endoscope 13100 may be a forward view scope, an oblique view scope, or a lateral view scope.

The camera head 13102 includes an optical system and a photoelectric conversion apparatus inside. The reflected light (observation light) from the observation target is collected to the photoelectric conversion apparatus by the optical system. The photoelectric conversion apparatus photoelectrically converts the observation light to generate an electrical signal corresponding to the observation light, i.e., an image signal corresponding to the observation image. One of the photoelectric conversion apparatuses according to the foregoing exemplary embodiments can be used as the photoelectric conversion apparatus. The image signal is transmitted to a camera control unit (CCU) 13135 as raw data.

The CCU 13135 includes a central processing unit (CPU) and a graphics processing unit (GPU), and controls operation of the endoscope 13100 and a display apparatus 13136 in a centralized manner. The CCU 13135 receives the image signal from the camera head 13102 and applies various types of image processing for displaying an image based on the image signal to the image signal. Examples of the image processing include development processing (demosaicing processing).

The display apparatus 13136 displays the image based on the image signal to which the image processing is applied by the CCU 13135 under the control of the CCU 13135.

The light source apparatus 13203 includes a light source such as a light-emitting diode (LED). The light source apparatus 13203 supplies the endoscope 13100 with illumination light in capturing an image of an operation site.

An input apparatus 13137 is an input interface for the endoscopic surgery system 13003. The user can input various types of information and instructions to the endoscopic surgery system 13003 via the input apparatus 13137.

A treatment tool control apparatus 13138 controls driving of an energy treatment tool 13112 for tissue cauterization, incision, or blood vessel sealing.

Examples of the light source apparatus 13203 for supplying the endoscope 13100 with the illumination light in capturing an image of the operation site may include an LED, a laser light source, and a white light source constituted by a combination thereof. If red, green, and blue (RGB) laser light sources are combined to constitute a white light source, the light source apparatus 13203 can adjust the white balance of the captured image since the output intensity and output timing of each color (each wavelength) can be controlled with high precision. In such a case, images corresponding to the respective RGB colors can also be captured in a time-division manner by irradiating the observation target with the laser light from the respective RGB laser light sources in a time-division manner and controlling the driving of the image sensor in the camera head 13102 in synchronization with the irradiation timing. According to such a method, a color image can be obtained without providing color filters on the image sensor.

The driving of the light source apparatus 13203 may be controlled so that the intensity of the output light changes at predetermined time intervals. A high dynamic range image without underexposure or overexposure can be generated by controlling the driving of the image sensor of the camera head 13102 in synchronization with the changing timing of the light intensity to obtain images in a time-division manner and combining the images.

The light source apparatus 13203 may be configured to be able to supply light in a predetermined wavelength band corresponding to special light observation. For example, the special light observation uses the wavelength dependence of light absorption in body tissue. Specifically, predetermined tissue such as blood vessels in a mucous membrane surface layer is irradiated with light in a narrower band than the illumination light during normal observation (i.e., white light), whereby a high contrast image of the tissue is captured. Alternatively, the special light observation may include fluorescence observation of obtaining an image based on fluorescence caused by excitation light irradiation. The fluorescence observation can include irradiating body tissue with the excitation light and observing fluorescence from the body tissue. A reagent such as indocyanine green (ICG) can be locally injected into body tissue and the body tissue can be irradiated with excitation light corresponding to the fluorescence wavelength of the reagent to obtain a fluorescence image. The light source apparatus 13203 can be configured to be able to supply narrowband light and/or excitation light corresponding to such special light observations.

Figure 21A:
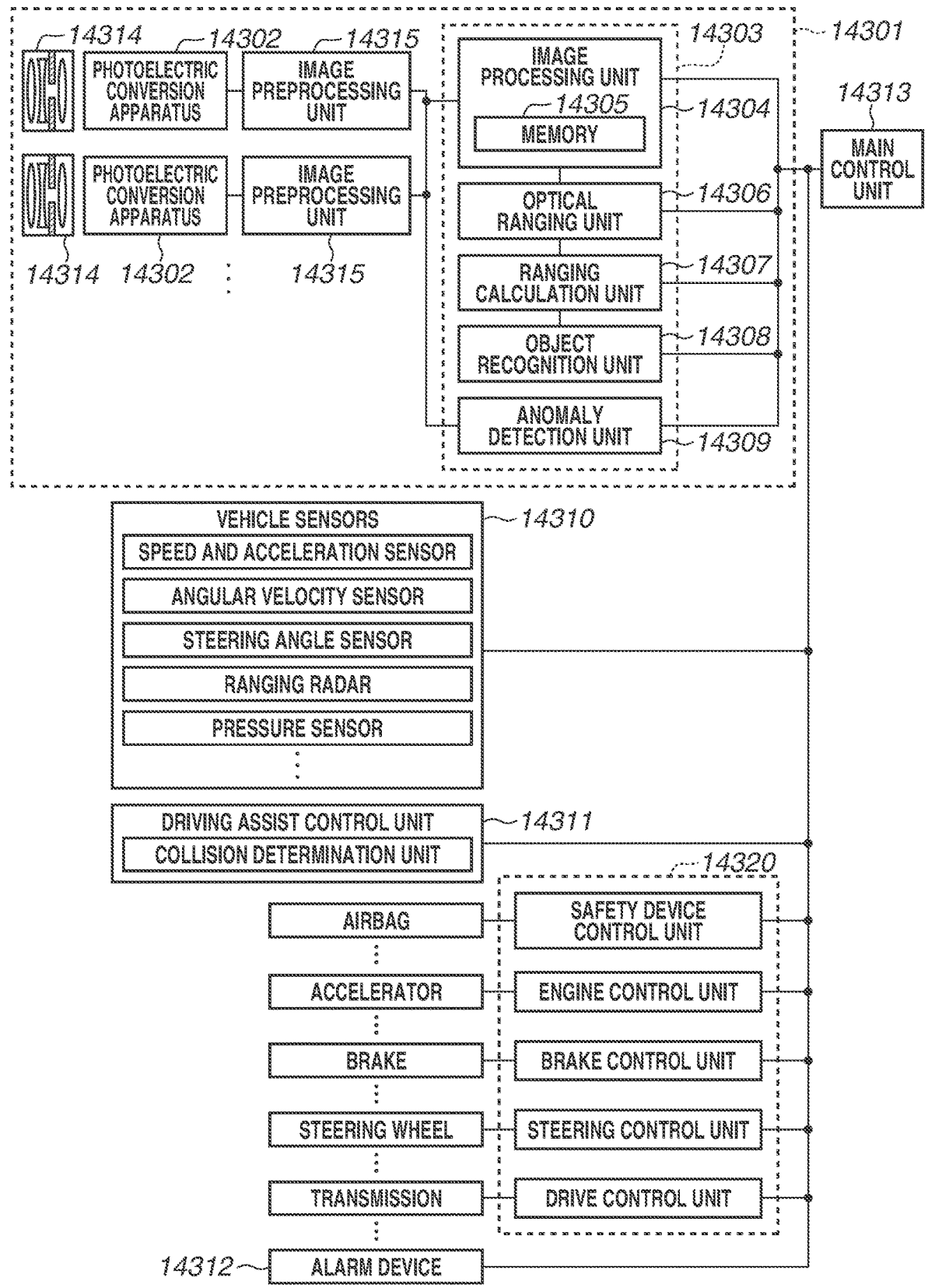

A photoelectric conversion system and a moving body according to a tenth exemplary embodiment will be described with reference to FIGS. 21A and 21B. FIGS. 21A and 21B are schematic diagrams illustrating a configuration example of the photoelectric conversion system and the moving body according to the present exemplary embodiment. In the present exemplary embodiment, an example of an on-vehicle camera will be described as the photoelectric conversion system.

FIGS. 21A and 21B illustrate an example of a vehicle system and an imaging photoelectric conversion system mounted thereon. A photoelectric conversion system 14301 includes photoelectric conversion apparatuses 14302, image preprocessing units 14315, an integrated circuit 14303, and optical systems 14314. The optical systems 14314 form optical images of an object on the photoelectric conversion apparatuses 14302. The photoelectric conversion apparatuses 14302 convert the optical images of the object formed by the optical systems 14314 into electrical signals. The photoelectric conversion apparatuses 14302 are photoelectric conversion apparatuses according to one of the foregoing exemplary embodiments. The image preprocessing units 14315 perform predetermined signal processing on the signals output from the photoelectric conversion apparatuses 14302. The functions of the image preprocessing units 14315 may be built in the photoelectric conversion apparatuses 14302. The photoelectric conversion system 14301 includes at least two sets of an optical system 14314, a photoelectric conversion apparatus 14302, and an image preprocessing unit 14315. The outputs from the image preprocessing units 14315 of the respective sets are input to the integrated circuit 14303.

The integrated circuit 14303 is one intended for an imaging system, and includes an image processing unit 14304 including a memory 14305, an optical ranging unit 14306, a ranging calculation unit 14307, an object recognition unit 14308, and an anomaly detection unit 14309. The image processing unit 14304 performs image processing such as developing processing and defect correction on the output signals of the image preprocessing units 14315. The memory 14305 primarily stores captured images and stores defect positions of imaging pixels. The optical ranging unit 14306 performs focusing and ranging on the object. The ranging calculation unit 14307 calculates ranging information from a plurality of pieces of image data obtained by the plurality of photoelectric conversion apparatuses 14302. The object recognition unit 14308 recognizes objects such as a vehicle, a road, a road sign, and a person. The anomaly detection unit 14309 detects an anomaly in the photoelectric conversion apparatuses 14302 and notifies a main control unit 14313 of the anomaly.

The integrated circuit 14303 may be implemented by dedicatedly designed hardware, software modules, or a combination of these. A field programmable gate array (FPGA) or an application-specific integrated circuit (ASIC) may be used for implementation. A combination of these may be used for implementation.

The main control unit 14313 governs and controls operation of the photoelectric conversion system 14301, vehicle sensors 14310, and control units 14320. Alternatively, the photoelectric conversion system 14301, the vehicle sensors 14310, and the control units 14320 may individually include communication I/Fs and each transmit and receive control signals via a communication network (for example, a Controller Area Network (CAN) standard) without the main control unit 14313.

The integrated circuit 14303 has a function of receiving control signals from the main control unit 14313, or being governed by its own control unit, and transmitting control signals and setting values to the photoelectric conversion apparatuses 14302.

The photoelectric conversion system 14301 is connected to the vehicle sensors 14310, and can detect the running states of the own vehicle such as a vehicle speed, a yaw rate, and a steering angle, as well as the environment outside the own vehicle and the states of other vehicles and obstacles. The vehicle sensors 14310 also serve as a distance information obtaining unit for obtaining distance information about a distance to an object. The photoelectric conversion system 14301 is also connected to a driving assist control unit 14311 that provides various types of driving assistance including automatic steering, automatic cruising, and collision prevention functions. In particular, the collision prevention function estimates a collision with another vehicle or an obstacle and determines the presence or absence of a collision based on the detection results of the photoelectric conversion system 14301 and the vehicle sensors 14310. The driving assist control unit 14311 performs avoidance control in the case where a collision is estimated, and activates a safety device upon collision.

The photoelectric conversion system 14301 is also connected to an alarm device 14312 that issues an alarm to the driver based on a result of a determination made by the collision determination unit. For example, if the result of the determination made by the collision determination unit indicates a high possibility of a collision, the main control unit 14313 performs vehicle control to avoid the collision or reduce damage by putting on the brake, releasing the accelerator, or reducing the engine output.

The alarm device 14312 alarms the user (driver) by issuing an alarm sound, displaying alarm information on a display screen of a car navigation system or an instrument panel, or vibrating the seatbelt or the steering wheel.

In the present exemplary embodiment, the photoelectric conversion system 14301 captures images around the vehicle, e.g., in front of or behind the vehicle. FIG. 21B illustrates a layout example of the photoelectric conversion system 14301 in a case where the photoelectric conversion system 14301 captures images in front of the vehicle.

The two photoelectric conversion apparatuses 14302 are located in a front part of a vehicle 14300. Specifically, the forward and backward direction of the vehicle 14300 or a centerline with respect to the outer shape (for example, vehicle width) of the vehicle 14300 is assumed as an axis of symmetry. In view of obtaining distance information between the vehicle 14300 and an object and determining the possibility of a collision, the two photoelectric conversion apparatuses 14302 are desirably arranged in a line symmetric manner about the axis of symmetry. The photoelectric conversion apparatuses 14302 are also desirably arranged to not interfere with the driver's field of view when the driver in the driver's seat visually observes the situation outside the vehicle 14300. The alarm device 14312 is desirably located to easily come into the driver's view.

In the present exemplary embodiment, the control to avoid collision with another vehicle has been described. However, the present exemplary embodiment is also applicable to automatic driving control to follow another vehicle or automatic driving control to avoid going off the lane. Moreover, the photoelectric conversion system 14301 is not limited to a vehicle such as an automobile, and can be applied to moving bodies (moving apparatuses) such as a ship, an aircraft, and an industrial robot. The photoelectric conversion system 14301 is not limited to a moving body, either, and can be widely applied to equipment using object recognition, such as an intelligent transport system (ITS).

The photoelectric conversion apparatuses 14302 according to the present exemplary embodiment may further be configured to be able to obtain various types of information such as distance information.

Figure 22A:
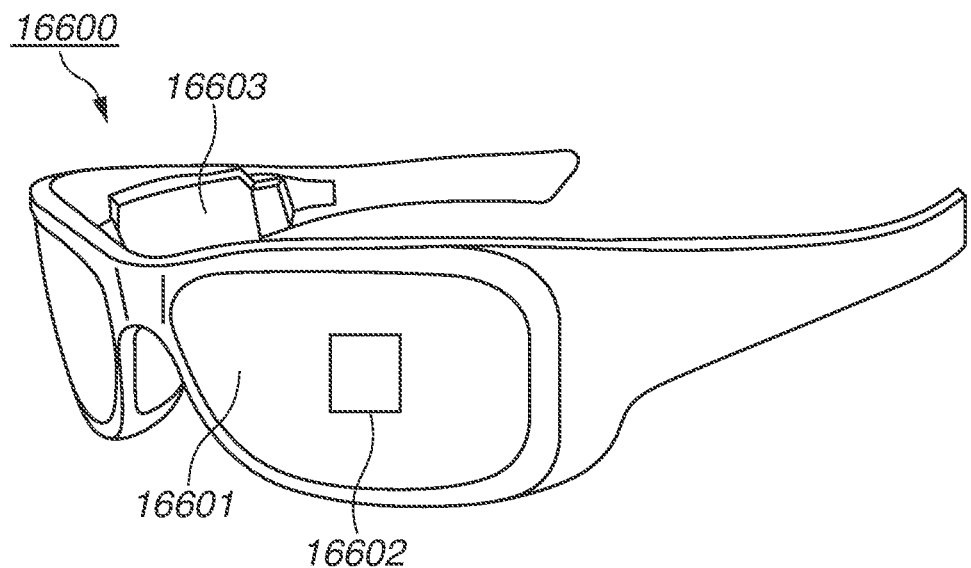
FIGS. 22A and 22B are perspective views of smart glasses according to an eleventh exemplary embodiment.

An eleventh exemplary embodiment will be described. FIG. 22A illustrates glasses 16600 (smart glasses) according to an application example. The glasses 16600 include a photoelectric conversion apparatus 16602. The photoelectric conversion apparatus 16602 is a photoelectric conversion apparatus according to one of the foregoing exemplary embodiments. A display apparatus including a light emitting device such as an organic light-emitting diode (OLED) or an LED may be disposed on the back side of a lens 16601. The glasses 16600 may include one or a plurality of photoelectric conversion apparatuses 16602. A plurality of types of photoelectric conversion apparatuses may be used in combination. The layout position of the photoelectric conversion apparatus 16602 is not limited to that in FIG. 22A.

The glasses 16600 further include a control apparatus 16603. The control apparatus 16603 functions as a power supply for supplying power to the photoelectric conversion apparatus 16602 and the display apparatus. The control apparatus 16603 also controls operation of the photoelectric conversion apparatus 16602 and the display apparatus. The lens 16601 includes an optical system for collecting light to the photoelectric conversion apparatus 16602.

Figure 22B:
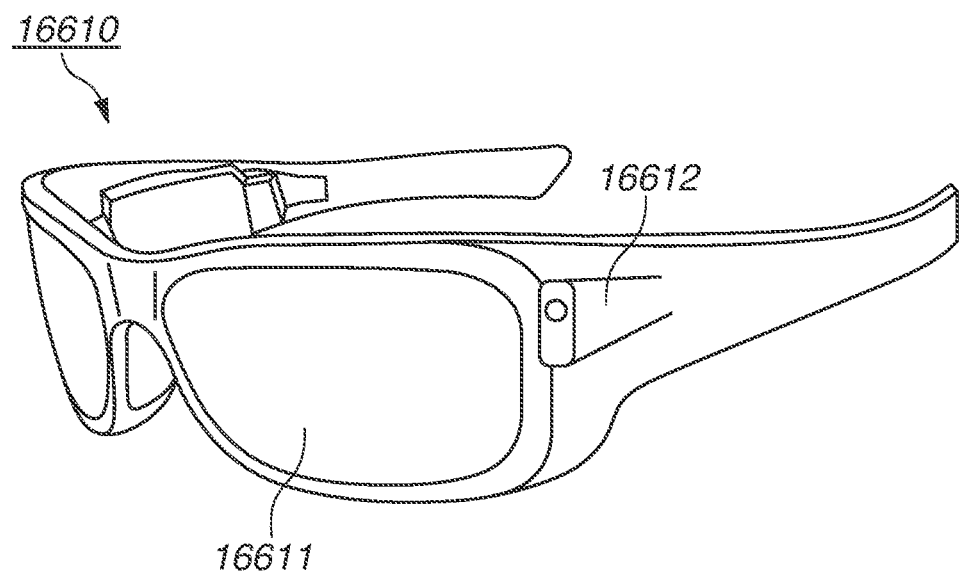

FIG. 22B illustrates glasses 16610 (smart glasses) according to another application example.

The glasses 16610 includes a control apparatus 16612. The control apparatus 16612 includes a photoelectric conversion apparatus corresponding to the photoelectric conversion apparatus 16602, and a display apparatus. A lens 16611 includes a part of the photoelectric conversion apparatus in the control apparatus 16612 and an optical system for projecting light emitted from the display apparatus, and an image is projected on the lens 16611. The control apparatus 16612 functions as a power supply for supplying power to the photoelectric conversion apparatus and the display apparatus, and controls operation of the photoelectric conversion apparatus and the display apparatus. The control apparatus 16612 may include a line of sight detection unit that detects the line of sight of the wearer (user). The line of sight may be detected using infrared rays. An infrared light emitting unit emits infrared rays to the user's eyeball gazing at a displayed image. An imaging unit including a light receiving element detects the reflection of the emitted infrared rays from the eyeball to obtain a captured image of the eyeball. The glasses 16610 include a reduction unit that reduces the light from the infrared light emitting unit to the display unit in a plan view to reduce a drop in image quality.

The user's line of sight to a displayed image is detected from the captured image of the eyeball obtained by infrared imaging. Any known technique can be applied to the detection of the line of sight using the captured image of the eyeball. For example, a line of sight detection method based on a Purkinje image of the reflection of the illumination light on the cornea can be used.

More specifically, line of sight detection processing based on a pupil conical reflection method is performed. Using the pupil corneal reflection method, the user's line of sight is detected by calculating a line of sight vector indicating the direction (rotation angle) of the eyeball based on a pupil image and a Purkinje image included in the captured image of the eyeball.

The display apparatus according to the present exemplary embodiment may include a photoelectric conversion apparatus including a light receiving element, and control a display image on the display apparatus based on the user's line of sight information from the photoelectric conversion apparatus.

Specifically, the display apparatus determines a first field of view region at which the user is gazing and a second field of view region other than the first field of view region based on the line of sight information. The first and second field of view regions may be determined by a control device of the display apparatus. First and second field of view regions determined by an external control device may be received. In a display area of the display apparatus, the display resolution of the first field of view region may be controlled to be higher than that of the second field of view region. In other words, the display resolution of the second field of view region may be made lower than that of the first field of view region.

The display area may include a first display region and a second display region different from the first display region, and a region of the higher priority may be determined from between the first display region and the second display region based on the line of sight information. The first and second display regions may be determined by the control device of the display apparatus. First and second display regions determined by an external control device may be received. The display resolution of the region of the higher priority may be controlled to be higher than that of the region other than the region of the higher priority. In other words, the display resolution of the region of relatively low priority may be made low.

The first field of view region or the region of the higher priority may be determined using artificial intelligence (AI). The AI may be a model configured to estimate the angle of the line of sight or the distance to an object in front of the line of sight from an eyeball image, with eyeball images and the actual directions of view of the eyeballs in the images as teaching data. An AI program may be included in the display apparatus, the photoelectric conversion apparatus, or the external apparatus. If the AI program is include in the external apparatus, the estimation is communicated to the display apparatus.

In the case of performing display control based on visual recognition detection, the present exemplary embodiment can be suitably applied to smart glasses further including a photoelectric conversion apparatus that captures an outside image. The smart glasses can display captured external information in real time.

Other Exemplary Embodiments

While the exemplary embodiments have been described above, the present invention is not limited to these exemplary embodiments, and various changes and modifications can be made. Moreover, the exemplary embodiments are mutually applicable. Specifically, a part of one of the exemplary embodiments can be replaced with a part of another exemplary embodiment. A part of one of the exemplary embodiments can be added as a part of another exemplary embodiment. A part of an exemplary embodiment can be omitted.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-008440, filed Jan. 22, 2021, which is hereby incorporated by reference herein in its entirety.

What is claimed is:

1. A photoelectric conversion apparatus comprising:
a first substrate including a first semiconductor layer and a first wiring structure, the first semiconductor layer including a plurality of photoelectric conversion units, the first wiring structure including at least one wiring layer; and
a second substrate including a second semiconductor layer and a second wiring structure, the second semiconductor layer including a plurality of pixel circuits disposed to correspond to the respective plurality of photoelectric conversion units, the second wiring structure including a plurality of wiring layers,
wherein each of the plurality of photoelectric conversion units includes an avalanche photodiode,
wherein the first substrate and the second substrate are stacked so that the first wiring structure and the second wiring structure are interposed between the first semiconductor layer and the second semiconductor layer,
wherein the plurality of wiring layers of the second wiring structure includes
a wiring layer where first wiring configured to supply a power supply voltage to the plurality of pixel circuits is disposed, the wiring layer having a largest occupation area of the first wiring among the plurality of wiring layers, and
a wiring layer group where the first wiring is disposed, the wiring layer group being interposed between the wiring layer and the second semiconductor layer, and
wherein in a plan view, the first wiring is configured so that both ends of a region including each of the plurality of pixel circuits in a first direction and both ends of the region in a second direction intersecting the first direction are connected by a combination of the wiring layer group.

2. The photoelectric conversion apparatus according to claim 1,
wherein the wiring layer group includes a first wiring layer and a second wiring layer,
wherein in the plan view, the first wiring on the first wiring layer of the wiring layer group is not connected to both ends of the region in the first direction, and
wherein in the plan view, the first wiring on the second wiring layer of the wiring layer group is not connected to both ends of the region in the second direction.

3. The photoelectric conversion apparatus according to claim 2, wherein in the plan view, the first wiring on the first wiring layer of the wiring layer group is not connected to both ends of the region in the second direction.

4. The photoelectric conversion apparatus according to claim 2,
wherein in the plan view, the first wiring on the first wiring layer of the wiring layer group is connected to both ends of the region in the second direction, and
wherein in the plan view, the first wiring on the second wiring layer of the wiring layer group is connected to both ends of the region in the first direction.

5. The photoelectric conversion apparatus according to claim 1,
wherein the wiring layer group includes a first wiring layer, a second wiring layer, and a third wiring layer,
wherein in the plan view, the first wiring on the first wiring layer of the wiring layer group is connected to both ends of the region including each of the plurality of pixel circuits in the first direction, and
wherein in the plan view, the first wiring is connected to both ends of the region including each of the plurality of pixel circuits in the second direction by a combination of the second wiring layer and the third wiring layer of the wiring layer group.

6. The photoelectric conversion apparatus according to claim 5,
wherein in the plan view, the first wiring on the first wiring layer of the wiring layer group is not connected to both ends of the region including each of the plurality of pixel circuits in the second direction,
wherein in the plan view, the first wiring on the second wiring layer of the wiring layer group is not connected to both ends of the region including each of the plurality of pixel circuits in the first direction and the second direction, and
wherein in the plan view, the first wiring on the third wiring layer of the wiring layer group is not connected to both ends of the region including each of the plurality of pixel circuits in the first direction and the second direction.

7. The photoelectric conversion apparatus according to claim 1, wherein the power supply voltage supplied by the first wiring is applied to the avalanche photodiode.

8. The photoelectric conversion apparatus according to claim 1, further comprising:
a wiring layer where second wiring configured to supply a power supply voltage having a value different from that of the power supply voltage supplied by the first wiring is disposed, the wiring layer having a largest occupation area of the second wiring among the plurality of wiring layers; and
a wiring layer group where the second wiring is disposed, the wiring layer group being interposed between the wiring layer having the largest occupation area of the second wiring among the plurality of wiring layers and the second semiconductor layer,
wherein in the plan view, the second wiring is configured so that both ends of the region including each of the plurality of pixel circuits in the first direction and both ends of the region in the second direction intersecting the first direction are connected by a combination of the wiring layer group.

9. The photoelectric conversion apparatus according to claim 8, wherein the power supply voltage supplied by the second wiring is applied to the plurality of pixel circuits.

10. The photoelectric conversion apparatus according to claim 1, wherein the plurality of pixel circuits is in a mirror symmetric arrangement.

11. The photoelectric conversion apparatus according to claim 1,
wherein the plurality of pixel circuits includes a pixel circuit of a first pixel and a pixel circuit of a second pixel,
wherein the pixel circuit of the first pixel includes a first counter circuit,
wherein the pixel circuit of the second pixel includes a second counter circuit,
wherein the first pixel and the second pixel are located to adjoin each other, and
wherein the first counter circuit and the second counter circuit are located to adjoin each other.

12. The photoelectric conversion apparatus according to claim 11, wherein the pixel circuit of the first pixel and the pixel circuit of the second pixel are in a mirror symmetric arrangement.

13. The photoelectric conversion apparatus according to claim 1,
wherein the plurality of pixel circuits includes a pixel circuit of a first pixel and a pixel circuit of a second pixel,
wherein the pixel circuit of the first pixel includes a first quenching element,
wherein the first pixel and the second pixel are located to adjoin each other, and
wherein the first quenching element is located at a corner of a region where the pixel circuit of the first pixel is disposed.

14. The photoelectric conversion apparatus according to claim 1,
wherein the plurality of pixel circuits includes a pixel circuit of a first pixel and a pixel circuit of a second pixel,
wherein the pixel circuit of the first pixel includes a first quenching element,
wherein the pixel circuit of the second pixel includes a second quenching element,
wherein the first pixel and the second pixel are located to adjoin each other, and
wherein the first quenching element and the second quenching element are located to adjoin each other.

15. The photoelectric conversion apparatus according to claim 1,
wherein the plurality of pixel circuits includes a pixel circuit of a first pixel and a pixel circuit of a second pixel,
wherein the pixel circuit of the first pixel includes a first waveform shaping circuit,
wherein the pixel circuit of the second pixel includes a second waveform shaping circuit,
wherein the first pixel and the second pixel are located to adjoin each other, and
wherein the first waveform shaping circuit and the second waveform shaping circuit are located to adjoin each other.

16. The photoelectric conversion apparatus according to claim 15,
wherein the pixel circuit of the first pixel includes a first quenching element, and
wherein the first waveform shaping circuit and the first quenching element are located to adjoin each other.

17. The photoelectric conversion apparatus according to claim 1, wherein at least one wiring layer in the wiring layer group is configured so that both ends of the region including each of the plurality of pixel circuits in the first direction and both ends of the region in the second direction intersecting the first direction are not connected.

18. A photoelectric conversion system comprising:
the photoelectric conversion apparatus according to claim 1; and
a signal processing unit configured to process a signal output by the photoelectric conversion apparatus.

19. A moving body comprising:
the photoelectric conversion apparatus according to claim 1;
a distance information obtaining unit configured to obtain distance information about a distance to an object from ranging information based on a signal from the photoelectric conversion apparatus; and
a control unit configured to control the moving body based on the distance information.

20. A photoelectric conversion apparatus comprising:
a first substrate including a first semiconductor layer and a first wiring structure, the first semiconductor layer including a plurality of photoelectric conversion units, the first wiring structure including at least one wiring layer; and
a second substrate including a second semiconductor layer and a second wiring structure, the second semiconductor layer including a plurality of pixel circuits disposed to correspond to the respective plurality of photoelectric conversion units, the second wiring structure including a plurality of wiring layers,
wherein the plurality of photoelectric conversion units each includes an avalanche photodiode,
wherein the first substrate and the second substrate are stacked so that the first wiring structure and the second wiring structure are interposed between the first semiconductor layer and the second semiconductor layer,
wherein the plurality of wiring layers of the second wiring structure includes a wiring layer group where first wiring configured to supply a power supply voltage to the plurality of pixel circuits is disposed,
wherein the wiring layer group includes a first wiring layer and a second wiring layer,
wherein in a plan view, the first wiring on the first wiring layer of the wiring layer group is not connected to at least both ends of a region including each of the plurality of pixel circuits in a first direction,
wherein in the plan view, the first wiring on the second wiring layer of the wiring layer group is not connected to at least both ends of the region in a second direction, and
wherein in the plan view, the first wiring is configured to be connected to both ends of the region in the first direction and both ends of the region in the second direction by a combination of the first wiring layer and the second wiring layer of the wiring layer group.

* * * * *